US009202545B2

(12) United States Patent
Sato et al.

(10) Patent No.: US 9,202,545 B2
(45) Date of Patent: Dec. 1, 2015

(54) MAGNETORESISTANCE EFFECT ELEMENT AND MAGNETIC MEMORY

(71) Applicant: TOHOKU UNIVERSITY, Sendai-shi, Miyagi (JP)

(72) Inventors: Hideo Sato, Sandai (JP); Shunsuke Fukami, Sendai (JP); Michihiko Yamanouchi, Sendai (JP); Shoji Ikeda, Sendai (JP); Fumihiro Matsukura, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 14/390,324

(22) PCT Filed: Mar. 25, 2013

(86) PCT No.: PCT/JP2013/058528
§ 371 (c)(1),
(2) Date: Oct. 2, 2014

(87) PCT Pub. No.: WO2013/153942
PCT Pub. Date: Oct. 17, 2013

(65) Prior Publication Data
US 2015/0109853 A1    Apr. 23, 2015

(30) Foreign Application Priority Data

Apr. 9, 2012   (JP) ................................ 2012-088846
May 15, 2012   (JP) ................................ 2012-111089

(51) Int. Cl.
*G11C 11/16* (2006.01)
*H01F 10/32* (2006.01)
(Continued)

(52) U.S. Cl.
CPC .......... *G11C 11/161* (2013.01); *G11C 11/1653* (2013.01); *H01F 10/3286* (2013.01); *H01L 27/228* (2013.01); *H01L 43/08* (2013.01); *G11C 11/16* (2013.01); *H01F 10/329* (2013.01)

(58) Field of Classification Search
CPC .. G11C 11/161; G11C 11/1653; G11C 11/16; H01F 10/3286; H01F 10/329
USPC .................. 365/158, 171, 173; 257/E27.005, 257/E21.665, 295, E43.004
See application file for complete search history.

(56) References Cited

U.S. PATENT DOCUMENTS 7,538,402 B2 *  5/2009  Fukumoto .............. B82Y 25/00
                                                    257/421
8,565,013 B2 * 10/2013  Bessho ................... H01L 43/08
                                                    365/158

(Continued)

FOREIGN PATENT DOCUMENTS

JP    A-2007-157840    6/2007
JP    A-2011-155073    8/2011
(Continued)

OTHER PUBLICATIONS

International Search Report issued in PCT/JP2013/058528 mailed Jun. 18, 2013.
(Continued)

*Primary Examiner* — Hoai V Ho
*Assistant Examiner* — Roberto Mancera
(74) *Attorney, Agent, or Firm* — Oliff PLC

(57) ABSTRACT

A magnetoresistance effect element including a recording layer of high thermal stability to perform perpendicular magnetic recording within a film surface, and a magnetic memory using the element. The element includes: a first ferromagnetic layer of an invariable magnetization direction; a second ferromagnetic layer of a variable magnetization direction; a first non-magnetic layer between the first and second ferromagnetic layers; current supply terminals connected to the first and second ferromagnetic layers; a non-magnetic coupling layer on a surface of the second ferromagnetic layer opposite the first non-magnetic layer; a third ferromagnetic layer of a variable magnetization direction on a surface of the non-magnetic coupling layer opposite the second ferromagnetic layer; and a second non-magnetic layer on a surface of the third ferromagnetic layer opposite the non-magnetic coupling layer. The second and third ferromagnetic layers have the same magnetization direction and are reversed in magnetization by spin injection with a current.

12 Claims, 26 Drawing Sheets

(51) Int. Cl.
*H01L 43/08* (2006.01)
*H01L 27/22* (2006.01)

(56) References Cited

U.S. PATENT DOCUMENTS

| | | | | | |
|---|---|---|---|---|---|
| 2006/0262594 | A1* | 11/2006 | Fukumoto | ............... | B82Y 25/00 365/158 |
| 2010/0233515 | A1* | 9/2010 | Kong | ................ | G11B 5/66 428/846 |
| 2012/0063221 | A1* | 3/2012 | Yamane | ................ | B82Y 25/00 365/173 |
| 2013/0028013 | A1* | 1/2013 | Ikeda | ................ | B82Y 25/00 365/158 |

FOREIGN PATENT DOCUMENTS

| | | |
|---|---|---|
| JP | A-2011-258596 | 12/2011 |
| JP | A-2012-64625 | 3/2012 |
| JP | A-2012-235015 | 11/2012 |
| WO | WO 2009/093387 A1 | 7/2009 |

OTHER PUBLICATIONS

International Preliminary Report on Patentability issued in PCT/JP2013/058528 issued Dec. 17, 2013.

Ikeda et al., "A Perpendicular-anisotropy CoFeB-MgO Magnetic Tunnel Junction," *Nature Materials*, 2010, vol. 9, pp. 721-724.

Yamanouchi et al., "Dependence of Magnetic Anisotropy on MgO Thickness and Buffer Layer in Co20Fe60B20-MgO Structure," *Journal of Applied Physics*, 2011, vol. 109, pp. 07C712-1 to 07C712-3.

Worledge et al., "Spin Torque Switching of Perpendicular Ta | CoFeB | MgO-based Magnetic Tunnel Junctions," *Applied Physics Letters*, 2011, vol. 98, pp. 022501-1 to 022501-3.

Parkin, "Systematic Variation of the Strength and Oscillation Period of Indirect Magnetic Exchange Coupling through the 3d, 4d, and 5d Transition Metals," *Physical Review Letters*, 1991, vol. 67 No. 25, pp. 3598-3601.

Yang et al., "First-principles Investigation of the Very Large Perpendicular Magnetic Anisotropy at Fe | MgO and Co | MgO Interfaces," *Physical Review*, 2011, vol. 84, pp. 054401-1 to 054401-5.

Abraham et al., "Investigation of Perpendicular Interface Magnetic Anisotropy in CoFeB Films Using Seed and Insertion Layers," *56th Magnetism and Magnetic Materials*, 2011.

* cited by examiner (a)

(b)

(c)

(a)

(b)

(a)

(b)

(a)

(b)

(a)

(b)

(a)

(b)

(c)

MAGNETORESISTANCE EFFECT ELEMENT AND MAGNETIC MEMORY

TECHNICAL FIELD

This invention relates to a magnetoresistance effect element and a magnetic memory (magnetic random access memory: MRAM) including the magnetoresistance effect element.

BACKGROUND ART

A magnetic memory (called an MRAM) including a conventional magnetoresistance effect element is described.

FIG. 24 shows a memory cell of the magnetic memory including the conventional magnetoresistance effect element. As shown in FIG. 24, a magnetic memory cell 2100 has a structure where a magnetoresistance effect element 2101 and a selection transistor 2102 are electrically connected in series. The selection transistor 2102 has a source electrode electrically connected to a source line 2103, a drain electrode electrically connected through the magnetoresistance effect element 2101 to a bit line 2104, and a gate electrode electrically connected to a word line 2105.

The magnetoresistance effect element 2101 basically has a three-layer structure with a first ferromagnetic layer 2106, a second ferromagnetic layer 2109, and a first non-magnetic layer 2110 provided between the first and second ferromagnetic layers 2106 and 2109. The resistance value of the magnetoresistance effect element is reduced if the respective magnetizations of the first and second ferromagnetic layers 2106 and 2109 are parallel and is increased if these magnetizations are antiparallel.

The memory cell 2100 of the magnetic memory assigns these two resistance conditions to bit information "0" and bit information "1." The magnetization direction of the first ferromagnetic layer 2106 is fixed. The magnetization of the second ferromagnetic layer 2109 is reversed by a spin transfer torque generated by a current supplied from the selection transistor. The current flowing from bottom to top of FIG. 24 results in antiparallel arrangement of the magnetizations. The current flowing in the opposite direction results in parallel arrangement of the magnetizations. Thus, the respective magnetization directions of the first and second ferromagnetic layers 2106 and 2109 can be changed to parallel arrangement or antiparallel arrangement in response to the direction of the current supplied from the selection transistor 2102. This changes the resistance value of the magnetoresistance effect element 2101, thereby allowing writing of bit information.

In the aforementioned example, the first ferromagnetic layer 2106 is described as a reference layer (also called a fixed layer) of fixed magnetization and the second ferromagnetic layer 2109 is described as a recording layer (also called a free layer) of a variable magnetization direction. Even if this structure is reversed, the function of the MRAM is still maintained.

In order to achieve the MRAM, the following three characteristics should be satisfied at the same time: the magnetoresistance effect element 2101 as a recording element should have a magnetoresistance change ratio (MR ratio) of 100% or more; the magnetization of the second ferromagnetic layer 2109 to become the recording layer should be reversed with a writing current lower than a drive current of the selection transistor (assuming that the gate width of the selection transistor is F nm, the drive current is about F µA); and the second ferromagnetic layer 2109 to become the recording layer should have a thermal stability constant ($E/k_B T$, where E is an energy barrier, $k_B$ is Boltzmann's constant, and T is the absolute temperature (K)) of 70 or more.

In a film structure of the magnetoresistance effect element 2101 known to achieve a high magnetoresistance change ratio, the first and second ferromagnetic layers 2106 and 2109 are formed of a material having the bcc structure including any one of 3d transition metal elements such as Fe, Co and Ni, and MgO is used for the first non-magnetic layer 2110. If the magnetoresistance effect element is made by using these materials, the first and second ferromagnetic layers 2106 and 2109 generally become thin compared to the size of the element. This makes a large demagnetizing field act in a direction perpendicular to a film surface. As a result, the respective magnetizations of the first and second ferromagnetic layers 2106 and 2109 point in a direction parallel to the film surface.

In order to reverse the direction of a magnetization using a spin transfer torque while the magnetization points in the direction parallel to the film surface, an energy barrier caused by the large demagnetizing field existing in the direction perpendicular to the film surface should be overcome. This leads to the problem of increase in a switching current.

This problem may be solved by the means of pointing the respective magnetization directions of the first and second ferromagnetic layers 2106 and 2109 in the perpendicular direction. In doing so, during magnetization reversal using a spin transfer torque, the demagnetizing field reduces the energy barrier caused during the magnetization reversal by the spin transfer torque. This allows reduction in the switching current.

FIG. 25 is a sectional view showing the structure of a magnetoresistance effect element 2101 reported in non-patent literature 1. As shown in FIG. 25, the magnetoresistance effect element 2101 includes a foundation layer 2201, a reference layer formed of a first ferromagnetic layer 2106 on the foundation layer 2201, a first non-magnetic layer 2110 formed on the reference layer, a recording layer formed of a second ferromagnetic layer 2109 on the first non-magnetic layer 2110, and a cap layer 2202 on the recording layer.

In the structure of the magnetoresistance effect element 2101 of non-patent literature 1, CoFeB is used for the first and second ferromagnetic layers 2106 and 2109, MgO is used for the first non-magnetic layer 2110, and a film of CoFeB is thinned. By using magnetic anisotropy generated at an interface with the MgO layer in the first non-magnetic layer 2110, magnetization can point in a direction perpendicular to a film surface.

Non-patent literature 1 reports that the aforementioned structure can achieve a thermal stability index of 40 and a low writing current of 49 µA in a device of a diameter of 40 nm while a high magnetoresistance change ratio (also called an MR ratio) of 100% or more is maintained. The thermal stability index of 40 is a numerical value sufficient for retaining one-bit information for 10 years. However, this value keeps a problem unsolved in that it is lower than a thermal stability index of 70 required to achieve an MRAM.

FIG. 26 is a sectional view showing the structure of a magnetoresistance effect element 2300 disclosed in patent literature 1. As shown in FIG. 26, the magnetoresistance effect element 2300 disclosed in FIG. 9 of patent literature 1 includes a foundation layer 2503, a fixed layer 2310 on the foundation layer 2503, a non-magnetic layer 2370 on the fixed layer 2310, a recording layer 2380 formed of a ferromagnetic layer on the non-magnetic layer 2370, and a cap layer 2504 on the recording layer 2380. The fixed layer 2310 has a five-layer structure with a non-magnetic layer 2311, a ferromagnetic layer 2312, a non-magnetic layer 2313, and a ferromagnetic layer 2314. Patent literature 1 discloses that making the magnetization direction of the fixed layer perpendicular to a film surface achieves stability, specifically enhances thermal stability. Patent literature 1 describes that the non-magnetic layer 2313 in the fixed layer 2310 generates magnetic coupling between the ferromagnetic layer 2312 and the ferromagnetic layer 2314, and that specific materials for the non-magnetic layer 2313 include an insulator such as MgO, $Al_2O_3$ or $SiO_2$, and metal made of Ru, Rh, V, Ir, Os or Re.

CITATION LIST

Patent Literature

Patent Literature 1: Japanese Patent Application Publication No. 2011-258596

Non-Patent Literatures

Non-Patent Literature 1: S. Ikeda, K. Miura, H. Yamamoto, K. Mizunuma, H. D. Gan, M. Endo, S. Kanai, F. Matsukura, and H. Ohno, Nature Mater., 9, 721, (2010)
Non-Patent Literature 2: M. Yamanouchi, R. Koizumi, S. Ikeda, H. Sato, K. Mizunuma, K. Miura, H. D. Gan, F. Matsukura, and H. Ohno, J. Appl. Phys. 109, 07C712, (2011)
Non-Patent Literature 3: D. C. Worledge, G. Hu, David W. Abraham, J. Z. Sun, P. L. Trouilloud, J. Nowak, S. Brown, M. C. Gaidis, E. J. O'Sullivan, and R. P. Robertazzi, Appl. Phys. Lett. 98, 022501, (2011)
Non-Patent Literature 4: S. S. P. Parkin, Phys. Rev. Lett. 67, 3598, (1991)
Non-Patent Literature 5: H. X. Yang, M. Chshiev, B. Dieny, J. H. Lee, A. Manchon, K. H. Shin, Phys. Rev. B. 84, 054401, (2011)
Non-Patent Literature 6: D. Abraham, D. C. Worledge, 56th Magnetism and Magnetic Materials, AF-01, AZ, USA, (2011)

SUMMARY OF INVENTION

Technical Problems

As described above, a magnetoresistance effect element to perform perpendicular magnetization recording has the problem of failing to include a recording layer of a high thermal stability index.

In view of the aforementioned problem, this invention is intended to provide a magnetoresistance effect element that includes a recording layer of high thermal stability to perform perpendicular magnetic recording, and a magnetic memory using the magnetoresistance effect element.

Solution to Problem

As a result of intensive study, the present inventors have found that a perpendicular magnetic anisotropy energy density in a perpendicular magnetic recording layer is not reduced if the recording layer has a layer structure with a second ferromagnetic layer, a non-magnetic coupling layer and a third ferromagnetic layer, the second and third ferromagnetic layers are made for example of a CoFeB alloy, and the non-magnetic coupling layer is made of Ta of a sufficiently small thickness. Then, the present inventors achieved thermal stability drastically higher than conventional thermal stability, thereby achieving this invention.

A magnetoresistance effect element of this invention includes: a fixed layer including a first ferromagnetic layer of an invariable magnetization direction; a second ferromagnetic layer of a variable magnetization direction; a first non-magnetic layer adjacent to the second ferromagnetic layer; a non-magnetic coupling layer adjacent to a surface of the second ferromagnetic layer on a side opposite the first non-magnetic layer; a third ferromagnetic layer of a variable magnetization direction adjacent to a surface of the non-magnetic coupling layer on a side opposite the second ferromagnetic layer; and a second non-magnetic layer adjacent to a surface of the third ferromagnetic layer on a side opposite the non-magnetic coupling layer. The second and third ferromagnetic layers have the same magnetization direction.

In the magnetoresistance effect element of this invention, a free layer has a three-layer structure with the second ferromagnetic layer, the non-magnetic coupling layer, and the third ferromagnetic layer, and the non-magnetic coupling layer is made for example of Ta. Thus, the recording layer can be thick while perpendicular magnetization is maintained, thereby allowing drastic increase in a thermal stability index.

In the magnetoresistance effect element of this invention, it is preferable that the non-magnetic coupling layer be made of metal including at least one of Ta, Hf, Zr, Nb, Mo and Ti. It is particularly preferable that the non-magnetic coupling layer be metal including Ta. In this case, the non-magnetic coupling layer absorbs an additive such as B or C from the second and third ferromagnetic layers as a result of thermal process, thereby facilitating crystallization of the second and third ferromagnetic layers. Additionally, the non-magnetic coupling layer does not reduce a perpendicular magnetic anisotropy energy density in the second and third ferromagnetic layers. The present inventors confirmed by experiment that these effects can be achieved by using Ta for the non-magnetic coupling layer. Further, theoretical speculation shows that using Hf, Zr, Nb, Mo or Ti achieves effect comparable to that achieved by using Ta.

In the magnetoresistance effect element of this invention, it is preferable that the second and third ferromagnetic layers include at least one of Fe, Co and Ni, and at least one of B, C, N, O, F, Si, Al, P and S. It is particularly preferable that the second and third ferromagnetic layers include Co, Fe and B. More specifically, it is preferable that the second and third ferromagnetic layers be made of a Co—Fe—B alloy, for example.

In the magnetoresistance effect element of this invention, it is preferable that the first and second non-magnetic layers include at least one of N, O and C. It is particularly preferable that the first and second non-magnetic layers be made of magnesium oxide. More specifically, the first and second non-magnetic layers are made of Mg—O, Al—O or Si—O, for example.

It is preferable that the second non-magnetic layer have a thickness from 0.5 to 2 nm and the first non-magnetic layer be thinner than the second non-magnetic layer. Magnetoresistance effect is used to read information from the magnetoresistance effect element of this invention. The second non-magnetic layer affects the resistance value of this magnetoresistance effect. Thus, it is desirable that the second non-magnetic layer have a thickness with which favorable reading characteristics can be obtained. As an example, if Mg—O is used for the first non-magnetic layer, the tunnel resistance of the first non-magnetic layer changes exponentially relative to the thickness of the Mg—O layer. The tunnel resistance of the magnetoresistance effect element is generally designed to be from 0.5 to 100 kΩ in order to obtain favorable reading characteristics. The thickness of the Mg—O layer with which such a tunnel resistance can be achieved is generally from about 0.5 to about 2 nm, although depending on an element size. The first non-magnetic layer has such a thickness as is required only to provide perpendicular magnetic anisotropy to the second ferromagnetic layer. This is generally achieved with a thickness of 0.5 nm or more if Mg—O is used for the first non-magnetic layer.

In the magnetoresistance effect element of this invention, it is preferable that the non-magnetic coupling layer have a thickness of 0.2 nm or more and less than 1.0 nm. It is particularly preferable that the non-magnetic coupling layer have a thickness of 0.2 nm or more and less than 0.6 nm. Making the non-magnetic coupling layer too thin cancels out the effect of absorbing an additive element from the second and third ferromagnetic layers, so that an axis of easy magnetization in the second and third ferromagnetic layers becomes hard to point in the perpendicular direction. Meanwhile, making the non-magnetic coupling layer too thick makes the second and third ferromagnetic layers behave independently to cancel out the effect of enhancing thermal stability. An upper limit and a lower limit of the thickness of the non-magnetic coupling layer are determined in view of these circumstances.

The present inventors used Ta for the non-magnetic coupling layer and made elements with the thickness of the Ta layer ranging from 0 to 1.0 nm. Then, the present inventors examined by experiment the behavior of the thickness on the magnetization conditions of the second and third ferromagnetic layers, an external magnetic field, and a current. As a result, the present inventors confirmed that an axis of easy magnetization is not formed in the second and third ferromagnetic layers with the Ta thickness of less than 0.2 nm, and that the second and third ferromagnetic layers achieve perpendicular magnetization but they behave independently for the reason of weak coupling therebetween with the Ta thickness of 0.6 nm or more. This thickness range can be changed appropriately depending on a material for the non-magnetic coupling layer, a material for the second and third ferromagnetic layers and the respective thicknesses of the second and third ferromagnetic layers, and a temperature of thermal process to be performed after films of the magnetoresistance effect element are deposited.

In the magnetoresistance effect element of this invention, it is preferable that the second and third ferromagnetic layers have a thickness from 0.8 to 60 nm. Regarding a lower limit of a total of the respective thicknesses of the second and third ferromagnetic layers, the lower limit can be as low as possible as long as the perpendicular direction becomes an axis of easy magnetization in the second and third ferromagnetic layers. Theoretically, the lower limit of the thickness is zero. However, reducing the thickness actually makes the second and third ferromagnetic layers behave paramagnetically gradually. The thickness at which a transition is made from ferromagnetism to paramagnetism, which strongly depends on the condition of deposition or annealing of a thin film, is generally from about 0.4 to about 0.9 nm. Thus, it is preferable that a total of the respective thicknesses of the second and third ferromagnetic layers be 0.8 nm or more. The total of the respective thicknesses of these ferromagnetic layers should be increased in order to enhance thermal stability, stability of operation, and ease of manufacture. Thus, it is more preferable that the total of the respective thicknesses of the second and third ferromagnetic layers be 2 nm or more.

In the magnetoresistance effect element of this invention, it is preferable that the magnetoresistance effect element include a first current terminal connected to the first ferromagnetic layer and a second current terminal connected to the second ferromagnetic layer, that the first ferromagnetic layer be adjacent to a surface opposite the second ferromagnetic layer with respect to the first non-magnetic layer, and that the second and third ferromagnetic layers be reversed in magnetization by spin injection with a current.

In this case, a magnetic memory of this invention includes: multiple source lines parallel to each other; multiple word lines parallel to each other in a direction crossing the source lines; multiple bit lines parallel to the source lines; the magnetoresistance effect element of this invention arranged in a place where the bit line and the word line cross each other; and a circuit that applies a current in a direction perpendicular to a film surface of the magnetoresistance effect element. One of the terminals of the magnetoresistance effect element is electrically connected to a source electrode or a drain electrode of a selection transistor and the other of the terminals of the magnetoresistance effect element is electrically connected to the bit line. The word line is electrically connected to a gate electrode of the selection transistor. The source line is electrically connected to the source electrode or the drain electrode of the selection transistor.

In the magnetoresistance effect element of this invention, the magnetoresistance effect element may include a first current terminal, a second current terminal, and a third current terminal. The second and third ferromagnetic layers may include a first magnetization fixed area, a second magnetization fixed area, and a magnetization free area of a variable magnetization direction. The first and second magnetization fixed areas are magnetized in opposite directions. The fixed layer may be connected to the first current terminal. The first magnetization fixed area may be connected to the second current terminal. The second magnetization fixed area may be connected to the third current terminal.

In this case, a magnetic memory of this invention includes: multiple first bit lines and multiple second bit lines parallel to each other; multiple word lines parallel to each other in a direction crossing the first bit lines and the second bit lines; the magnetoresistance effect element of this invention arranged in a place where the first bit line and the second bit line cross the word line; and a circuit that applies a current into a film surface of the magnetoresistance effect element and in a direction perpendicular to the film surface. The second current terminal is electrically connected to a source electrode or a drain electrode of a first selection transistor. The third current terminal is electrically connected to a source electrode or a drain electrode of a second selection transistor. The other of the source and drain electrodes of the first selection transistor is electrically connected to the first bit line. The other of the source and drain electrodes of the second selection transistor is electrically connected to the second bit line. A gate electrode of the first selection transistor is connected to the word line and a gate electrode of the second selection transistor is connected to the word line.

In the presence of the first to third current terminals, the magnetoresistance effect element of this invention includes a stacked structure with a stack of a ferromagnetic layer and a non-magnetic layer applied to a three-terminal magnetic memory of a movable magnetic wall. Thus, the magnetoresistance effect element is provided with a low writing current and a large reading signal simultaneously. Further, a first magnetization free layer has a stacked structure including at least the first non-magnetic layer, the second ferromagnetic layer, the non-magnetic coupling layer, and the third ferromagnetic layer that are stacked in the order named. A total of the respective thicknesses of the second and third ferromagnetic layers can be large. This can enhance the characteristics of retaining data dramatically, so that thermal stability, stability of operation, and ease of manufacture can be enhanced.

In this case, it is preferable that interface magnetic anisotropy generated at a first interface formed at a boundary between the second ferromagnetic layer and the first non-magnetic layer and at a second interface formed at a boundary between the third ferromagnetic layer and the second non-magnetic layer point an axis of easy magnetization in the second and third ferromagnetic layers in a direction perpendicular to a substrate. In this case, a combination of materials for the second and third ferromagnetic layers and the second and first non-magnetic layers should be determined such that interface magnetic anisotropy in the direction perpendicular to the substrate is generated at the first and second interfaces. The second and third ferromagnetic layers should be coupled magnetically. Thus, it is preferable that the non-magnetic coupling layer be sufficiently thin. Each of the first non-magnetic layer, the second ferromagnetic layer, the non-magnetic coupling layer, and the third ferromagnetic layer is not always required to be made of a single material but it may have a stacked structure of multiple different materials.

The magnetic memory of this invention can write information into the magnetoresistance effect element of this invention and can read information from the magnetoresistance effect element of this invention. The magnetic memory of this invention uses the magnetoresistance effect element of this invention and has a low writing current and a large reading signal accordingly. Further, the magnetic memory of this invention features high thermal stability, highly stable operation, and great ease of manufacture.

In the magnetoresistance effect element of this invention, the fixed layer may be formed of the first ferromagnetic layer, a second non-magnetic coupling layer, and a fourth ferromagnetic layer, and the magnetization direction of the fourth ferromagnetic layer may be the same as that of the first ferromagnetic layer. Alternatively, the fixed layer may be formed of the first ferromagnetic layer, a third non-magnetic coupling layer, and a fifth ferromagnetic layer, and the magnetization direction of the fifth ferromagnetic layer may be opposite that of the first ferromagnetic layer. Further, a fourth non-magnetic coupling layer and a sixth ferromagnetic layer of an invariable magnetization direction same as that of the first ferromagnetic layer may be provided between the first ferromagnetic layer and the third non-magnetic coupling layer. The third non-magnetic coupling layer may be made of metal including at least one of Ru, Rh, Ir and Cr. The second and fourth non-magnetic coupling layers may be made of an alloy including at least one of Ta, Cr and V. The fourth, fifth, and sixth ferromagnetic layers may each be formed of a stacked film formed by stacking metal including at least one of Co, Fe and Ni and metal including Pt or Pd alternately.

In the magnetoresistance effect element of this invention, at least a part of the fixed layer may be arranged so as to overlap an area extending from the magnetization free area in the magnetization direction of the first magnetization fixed area and that of the second magnetization fixed area. In this case, a current flows in a direction in which the current passes through the fixed layer, the second non-magnetic layer, and the magnetization free area. Thus, magnetoresistance effect generated by a relative angle formed between the magnetization of the magnetization free area and that of the fixed layer can be used to read storage information from the magnetization free area. At least the part of the fixed layer is required to overlap the magnetization free area. The fixed layer may be formed to be larger than the magnetization free area.

Advantageous Effects of Invention

This invention is capable of providing a magnetoresistance effect element that includes a recording layer of high thermal stability to perform perpendicular magnetic recording, and a magnetic memory using the magnetoresistance effect element.

DESCRIPTION OF EMBODIMENTS

Figure 1:
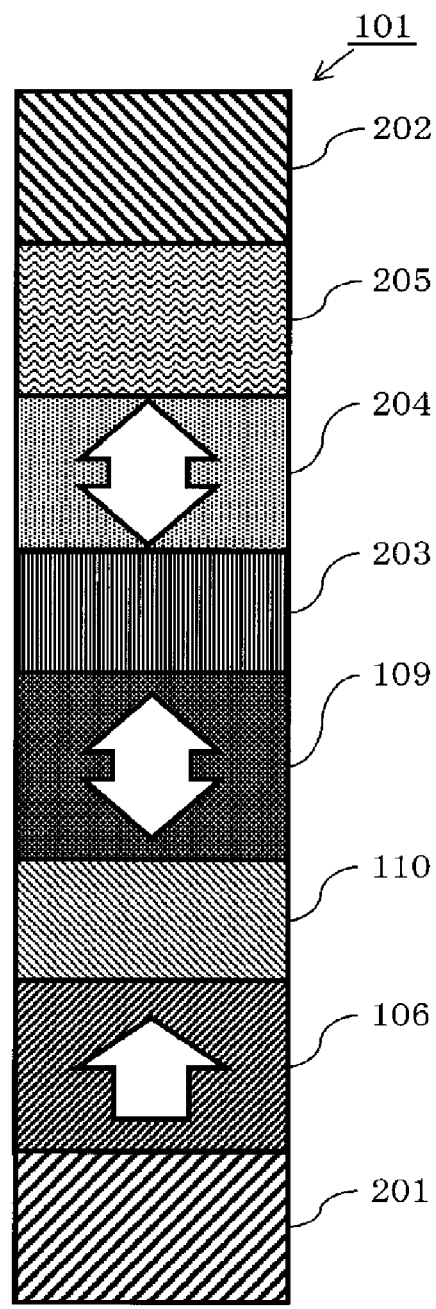
FIG. 1 is a sectional view showing a magnetoresistance effect element of a first embodiment of this invention.

Based on some embodiments of this invention, this invention will be described in detail below by referring to the drawings.

[Magnetoresistance Effect Element of First Embodiment of this Invention]

Figure 2:
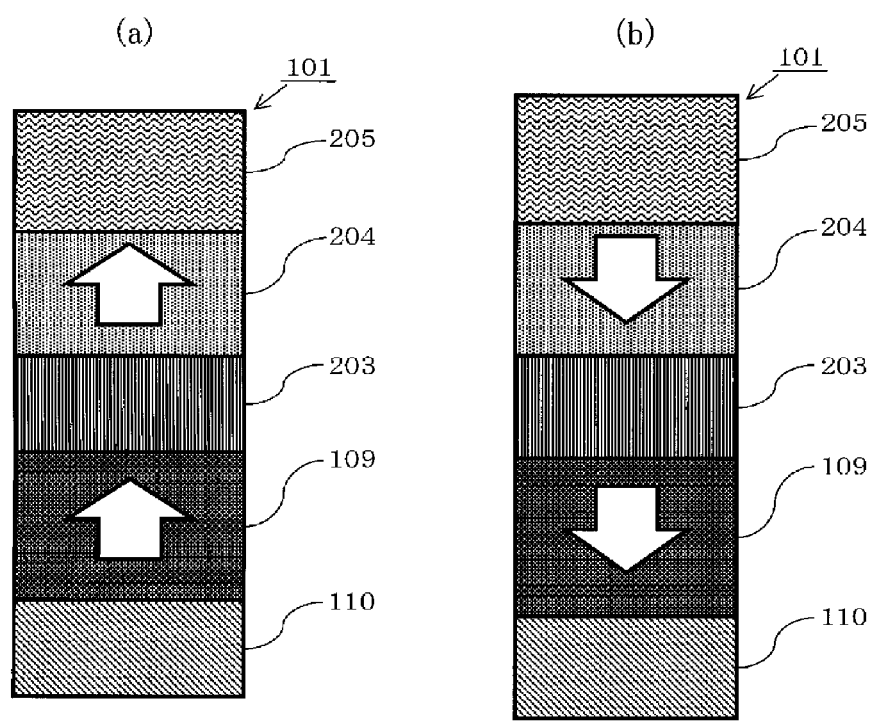
FIG. 2 is a schematic view showing magnetization of a free layer in the magnetoresistance effect element of the first embodiment of this invention.

FIG. 1 a sectional view showing the structure of a magnetoresistance effect element 101 of a first embodiment of this invention. FIG. 2 is a schematic view showing magnetization of a free layer in the magnetoresistance effect element 101 of this invention.

As shown in FIG. 1, the magnetoresistance effect element 101 includes: a foundation layer 201; a fixed layer formed of a first ferromagnetic layer 106 adjacent to the foundation layer 201 and which has a perpendicular magnetization direction within a film surface; a first non-magnetic layer 110 adjacent to the fixed layer; a free layer formed of a second ferromagnetic layer 109 adjacent to the first non-magnetic layer 110, a non-magnetic coupling layer 203, and a third ferromagnetic layer 204; a second non-magnetic layer 205 adjacent to the third ferromagnetic layer 204; and a cap layer 202 on the second non-magnetic layer 205. The fixed layer of fixed magnetization is also called a reference layer in contrast to the free layer of variable magnetization. The free layer of a variable magnetization direction is also called a recording layer as it permits recording in response to the magnetization direction of the free layer.

The first ferromagnetic layer 106 to become the fixed layer (reference layer) has a fixed magnetization direction.

The second and third ferromagnetic layers 109 and 204 in the free layer (recording layer) of a variable magnetization direction are made of a material including at least one of 3d ferromagnetic transition metals such as Co, Fe, and Ni and at least one of additives such as B and C.

The foundation layer 201 and the cap layer 202 are also called electrodes or electrode layers and become current supply terminals of the magnetoresistance effect element 101. The foundation layer 201 may be formed on a substrate. Examples of such a substrate include an MgO substrate, an Si substrate, and an Si substrate with a thermally oxidized film.

A candidate material for the foundation layer 201 is one that achieves small surface roughness and bcc <001> orientation in a direction perpendicular to a film surface in the first ferromagnetic layer 106. More specifically, Ta and a Ta/Ru/Ta stacked film formed by stacking Ta and Ru alternately is used as the foundation layer 201. A specific material for the cap layer 202 is Ta, for example.

As shown in FIG. 2(a), in the aforementioned free layer, the respective magnetization directions of the second and third ferromagnetic layers 109 and 204 are the same and perpendicular to a plane, specifically these magnetization directions are perpendicular to the plane of the second ferromagnetic layer 109 and correspond to the perpendicular directions in the plane of the sheet indicated by up-arrows of FIG. 2(a). As shown in FIG. 2(a), the respective magnetization directions of the second and third ferromagnetic layers 109 and 204 can be changed by reversing the flow of a current to flow into an electrode formed of the foundation layer 201 and the cap layer 202 (see FIG. 2(b)). Specifically, the aforementioned free layer is a layer that allows magnetization reversal by spin injection. Regarding a magnetization direction, a direction perpendicular to a plane may also be called a perpendicular magnetization direction and an in-plane direction may also be called a horizontal magnetization direction.

A material for the first non-magnetic layer 110 is a compound including oxygen such as $MgO$, $Al_2O_3$ or $SiO_2$. It is desirable that the material for the first non-magnetic layer 101 increase a magnetoresistance change ratio in combination with materials for the first and second ferromagnetic layers 106 and 109 and generate interface magnetic anisotropy.

It is desirable that a material for the second non-magnetic layer 205 generate magnetic anisotropy at an interface with the third ferromagnetic layer 204 in the recording layer. The material for the second non-magnetic layer 205 may be a compound including oxygen such as $MgO$, $Al_2O_3$ or $SiO_2$.

What is important for a material for the non-magnetic coupling layer 203 in the recording layer is that this material can absorb an additive such as B or C from the second and third ferromagnetic layers 109 and 204 as a result of thermal process and that this material does not reduce a perpendicular magnetic anisotropy energy density in the second and third ferromagnetic layers 109 and 204. The material for a non-magnetic layer in the second non-magnetic coupling layer 203 may be Ta, Hf, W, Zr, Nb, Mo or Ti, for example. Of these materials cited, Ta was found to be the most desirable material.

A ferromagnetic substance including three types of atoms in CoFeB can be used for the second and third ferromagnetic layers 109 and 204. In this case, if the atomic composition of CoFeB is expressed as $(Co_{100-X}Fe_X)_{100-Y}B_Y$, it is preferable that the composition Y of B be in a range from 15% to 25% in terms of an atomic number ratio, and that the composition X of Fe is in a range of 20% or more in terms of an atomic number ratio. Further, a total of the respective thicknesses of the second and third ferromagnetic layers 109 and 204 should be set in a range capable of maintaining perpendicular magnetization.

A thickness capable of maintaining the perpendicular magnetization of the recording layer is described next.

A ferromagnetic substance having two interfaces where interface magnetic anisotropy is generated has magnetic energy expressed by the following formula:

$$K_{eff} = 2K_i/t - M_s^2/2\mu_0 \tag{1}$$

If an effective magnetic anisotropy energy density is given a minus sign, an in-plane direction becomes an axis of easy magnetization. If the effective magnetic anisotropy energy density is given a plus sign, a direction perpendicular to a plane becomes an axis of easy magnetization.

Assuming that $K_{eff}=0$, the following formula (2) is established accordingly relating to a critical film thickness ($t_{th}$) at which an axis of easy magnetization is changed from the in-plane direction to the direction perpendicular to a plane:

$$t_{th}=2K_i/(M_s^2/2\mu_0) \quad (2)$$

The formula (2) shows that increase in $K_i$ and reduction in $M_s$ effectively act to increase the critical film thickness.

Non-patent literature 5 shows that $K_i$ obtained in an ideal Fe/MgO structure is about 3 mJ/m². Regarding $M_s$, non-patent literature 6 uses a CoFeB composition that results in 0.38 T. The critical film thickness $t_{th}$ obtained by substituting these values into the formula (2) becomes 60 nm. Thus, the total of the respective thicknesses of the second and third ferromagnetic layers 109 and 204 is design to be 60 nm or less.

The thickness of the non-magnetic coupling layer 203 in the recording layer is set to a film thickness that supplies magnetic coupling of a sufficient magnitude between the second and third ferromagnetic layers 109 and 204.

Studies on Ru and Pd were also conducted as to the non-magnetic coupling layer 203.

Figure 3:
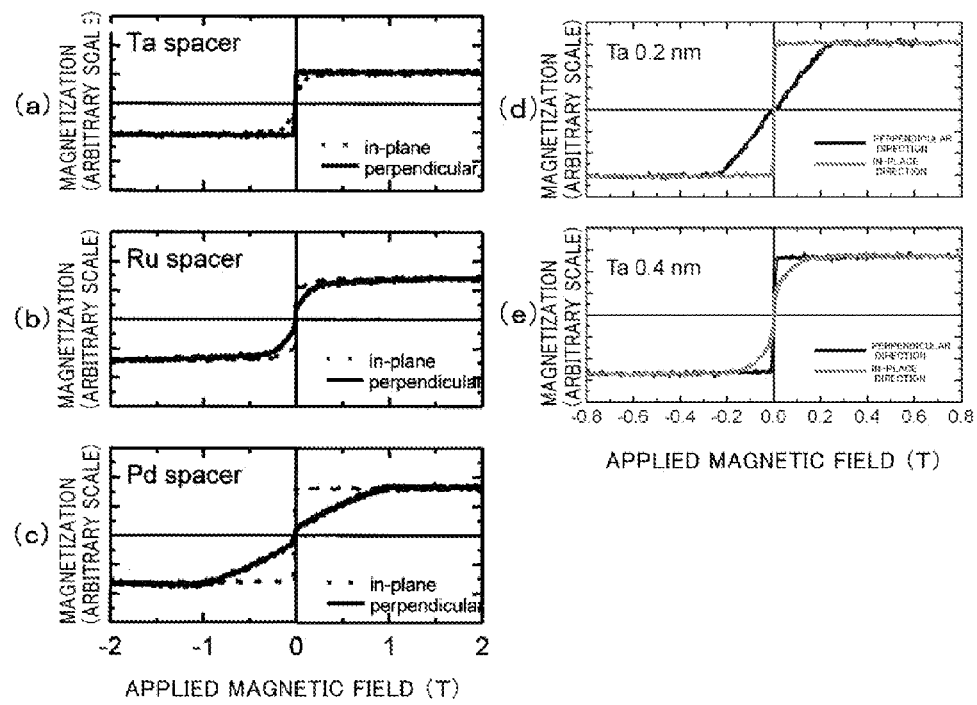
FIGS. 3(a) to 3(c) show magnetization curves obtained by using Ta, Ru and Pd as materials for a non-magnetic coupling layer respectively.
FIGS. 3(d) and 3(e) show magnetization curves obtained by using Ta as a material for the non-magnetic coupling layer and forming the non-magnetic coupling layer into different thicknesses.

FIGS. 3(a) to 3(e) are magnetization curves obtained by using Ta, Ru and Pd as materials for the non-magnetic coupling layer 203 respectively. FIG. 3 shows magnetization curves of stacked films in the structure of the magnetoresistance effect element 101 shown in FIG. 1 obtained by using Ta, Ru and Pd as materials for the non-magnetic coupling layer 203 and using CoFeB for the second and third ferromagnetic layers 109 and 204. The horizontal axis of FIG. 3 shows an applied magnetic field $\mu_0H(T)$ and the vertical axis of FIG. 3 shows magnetization (arbitrary scale). FIGS. 3(a) to 3(c) correspond to cases where Ta, Ru and Pd are used as materials for the non-magnetic coupling layer 203 respectively and the thickness of the non-magnetic coupling layer 203 is 0.4 nm. Solid lines show magnetization curves in the perpendicular direction and dotted lines show magnetization curves in the in-plane direction. FIGS. 3(d) and 3(e) correspond to cases where Ta is used as the material for the non-magnetic coupling layer 203 and the thickness of the non-magnetic coupling layer 203 is 0.2 nm and 0.4 nm respectively. Black solid lines show magnetization curves in the perpendicular direction and gray solid lines show magnetization curves in the in-plane direction.

It is seen from FIG. 3 that using Ta for the non-magnetic coupling layer 203 and forming the non-magnetic coupling layer 203 into a thickness of 0.4 nm points an axis of easy magnetization in the direction perpendicular to a plane. It is also seen from FIG. 3 that using Ru and Pd for the non-magnetic coupling layer 203 points an axis of easy magnetization in the in-plane direction. Specifically, in order to maintain an axis of easy magnetization in the CoFeB layer in the direction perpendicular to a plane, it is desirable that Ta be used for the non-magnetic coupling layer 203 and that the non-magnetic coupling layer 203 be formed to a thickness from about 0.3 to about 0.5 nm.

With the intention of exploring a material to become functional as the non-magnetic coupling layer 203, the present inventors used various materials as a foundation material or for the cap layer 202 in a stacked structure of Ta/MgO/CoFeB/Cap layer or a stacked structure of Ta/foundation layer/CoFeB/MgO/Ta, and examined dependence of the magnetic anisotropy energy density of the CoFeB layer on the foundation material (cap material). As a result, the present inventors confirmed that using a Rh cap reduces perpendicular magnetic anisotropy energy compared to use of a Ta cap. A perpendicular magnetic anisotropy energy density has been reported to become smaller by the use of V belonging to the same group as Ta than the use of Ta (see non-patent literature 6). A group of the present inventors confirmed a similar experimental fact.

Example 1

The magnetoresistance effect element 101 of the first embodiment of this invention can be made as follows.

First, the foundation layer 201, the fixed layer 106, the first non-magnetic layer 110, the recording layer formed of the second ferromagnetic layer 109, the non-magnetic coupling layer 203 and the third ferromagnetic layer 204, the second non-magnetic layer 205, and the cap layer 202 are deposited in the order named to respective given thicknesses on the Si substrate with a thermally oxidized film. An alloy including CoFeB and the like can be used as a ferromagnetic material for the free layer and the fixed layer 106. The aforementioned material such as Ta can be used for the non-magnetic coupling layer 203 in the free layer. The first and second non-magnetic layers 110 and 205 can be made of MgO. These layers can be deposited by a method such as sputtering as a physical vapor deposition method or molecular beam epitaxial growth method (MBE method), for example.

Next, in an electrode forming step, the magnetoresistance effect element 101 can be made by forming a pattern of the magnetoresistance effect element 101 in the foundation layer 201 and the cap layer 202 by a masking step or an etching step.

As seen from the foregoing result, according to this invention, the magnetoresistance effect element 101 exhibiting high thermal stability can be made by making the structure of FIG. 1 using Ta for the non-magnetic coupling layer 203.

The following conditions should be satisfied in order to make a recording layer of high thermal stability using the structure of this invention:

(1) The non-magnetic coupling layer 203 made for example of Ta should generate magnetic coupling between the second and third ferromagnetic layers 109 and 204;

(2) The non-magnetic coupling layer 203 can absorb B or C as a material for the recording layer after thermal process and can increase interface magnetic anisotropy generated between the second ferromagnetic layer 109 and the first non-magnetic layer 110 and between the third ferromagnetic layer 204 and the second non-magnetic layer 205;

(3) A perpendicular magnetic anisotropy energy density should not be reduced in the second and third ferromagnetic layers 109 and 204 in the recording layer; and (4) The non-magnetic coupling layer 203 can be thinned sufficiently in order to obtain magnetic coupling between the second and third ferromagnetic layers 109 and 204 in the recording layer.

Example 2

In consideration of the result of Example 1, in Example 2, the non-magnetic coupling layer 203 is made of Ta, the first ferromagnetic layer (fixed layer) 106, and the second and third ferromagnetic layers 109 and 204 in the recording layer are made of CoFeB, and the first and second non-magnetic layers 110 and 205 are made of MgO.

FIGS. 4(a) to 4(c) show the magnetoresistance effect of a magnetoresistance effect element 101 of Example 2 achieved in response to application of an external magnetic field. The horizontal axis shows a magnetic field $\mu_0H(mT)$ applied to the magnetoresistance effect element 101 and the vertical axis shows the resistance value (kΩ) of the magnetoresistance effect element 101.

Figure 4:
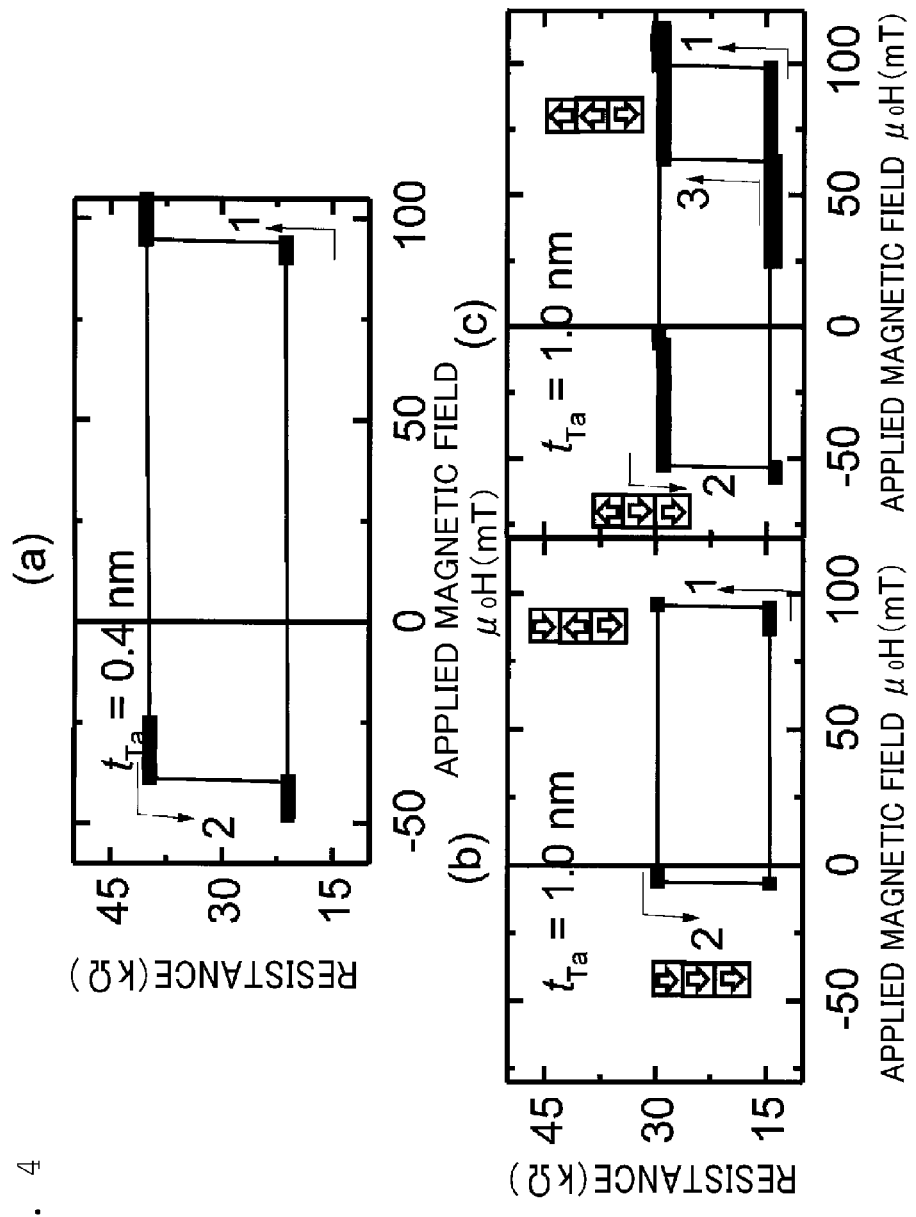
FIGS. 4(a) to 4(c) show the magnetoresistance effect of a magnetoresistance effect element of Example 2 achieved in response to application of an external magnetic field.

FIG. 4 shows results of measurement about change in the resistance of the magnetoresistance effect element 101 obtained by applying a magnetic field in a direction perpendicular to a film surface in the structure shown in FIG. 1 under the following exemplary conditions: the first ferromagnetic layer (fixed layer) 106 of fixed magnetization has a CoFeB film thickness of 0.9 nm, a CoFeB film thickness in the second ferromagnetic layer 109 to become the recording layer is 1.6 nm, a CoFeB film thickness in the third ferromagnetic layer 204 to become the recording layer is 1.0 nm, an MgO film thickness in each of the first and second non-magnetic layers 110 and 205 is 0.9 nm, and a Ta film thickness in the non-magnetic coupling layer 203 is changed between 0.4 nm and 1.0 nm.

As shown in FIG. 4(*a*), the magnetoresistance effect element 101 with the Ta film thickness ($t_{Ta}$) of 0.4 nm in the non-magnetic coupling layer 203 exhibits a typical minor RH curve.

In contrast, the Ta film thickness of 1.0 nm generates two types of minor RH curves shown in FIGS. 4(*b*) and 4(*c*). This results from weak magnetic coupling between the CoFeB layers through Ta. In both the cases of FIGS. 4(*b*) and 4(*c*), a large magnetic field is applied in a negative direction at the beginning of the measurement to align the respective magnetization directions of all the ferromagnetic layers in one direction (downward direction). As shown in FIG. 4(*b*), a magnetic field is applied in a positive direction and an external magnetic field is reduced immediately after the second ferromagnetic layer 109 is reversed. In the example shown in FIG. 4(*c*), application of a magnetic field in the positive direction continues after the second ferromagnetic layer 109 is reversed. An external magnetic field is reduced after a magnetic filed of 114 mT is applied.

In FIG. 4(*b*), the magnetization of the CoFeB layer on Ta forming the non-magnetic coupling layer 203 is not reversed but it is fixed in the downward direction while the magnetization of the CoFeB layer in the second ferromagnetic layer 109 is reversed. At this time, the magnetization direction of the first ferromagnetic layer 106 is also fixed in the downward direction. As a result, a dipole magnetic field is applied to the second ferromagnetic layer 109 from the first and third ferromagnetic layers 106 and 204. This results in a shift magnetic field of a considerably large value of 45 mT.

In the example of FIG. 4(*c*), a magnetic field strength in the positive direction is still increased even after the second ferromagnetic layer 109 is reversed. An RH curve is measured while the magnetization of the CoFeB layer on Ta to form the non-magnetic coupling layer 203 is also reversed, specifically while the magnetization direction of the CoFeB layer on Ta to form the non-magnetic coupling layer 203 is fixed in the upward direction. In this case, a dipole magnetic field from the third ferromagnetic layer 204 cancels out a dipole magnetic field from the first ferromagnetic layer 106, resulting in a shift magnetic field of a small value of 5 mT.

The aforementioned results show that Ta of 0.4 nm in the non-magnetic coupling layer 203 forms ferromagnetic coupling between the second and third ferromagnetic layers 109 and 204, and that Ta of 0.1 nm in the non-magnetic coupling layer 203 reverses the CoFeB layers above and below the non-magnetic coupling layer 203 independently.

This makes it clear that the Ta film thickness in the non-magnetic coupling layer 203 should be designed to be less than 1.0 nm in the magnetoresistance effect element 101 of this invention.

As described in the advantageous effects of invention, this invention is capable of enhancing the thermal stability of the magnetoresistance effect element 101.

Figure 5:
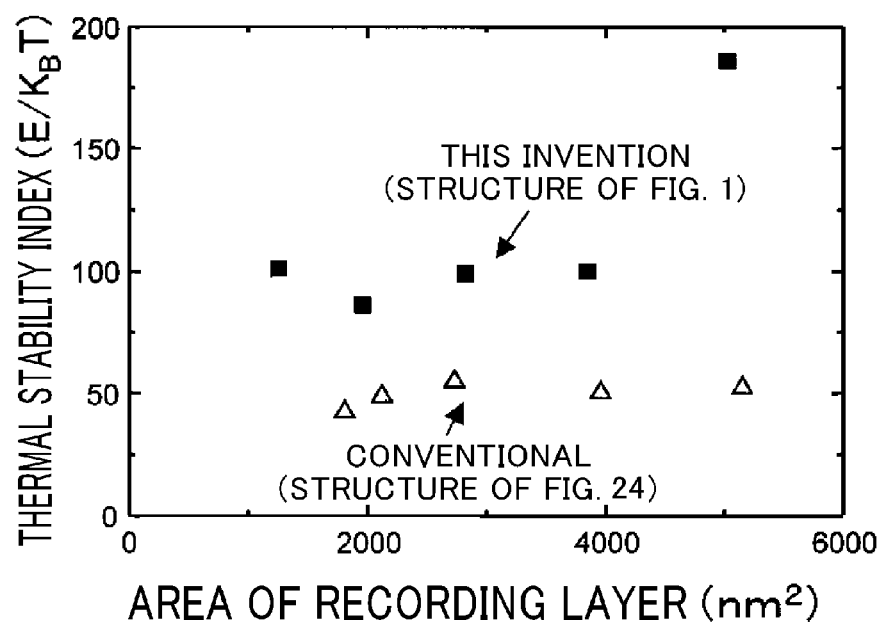
FIG. 5 shows a comparison between the thermal stability of the magnetoresistance effect element of the first embodiment of this invention and that of a magnetoresistance effect element of a conventional structure shown in FIG. 24.
Figure 24:
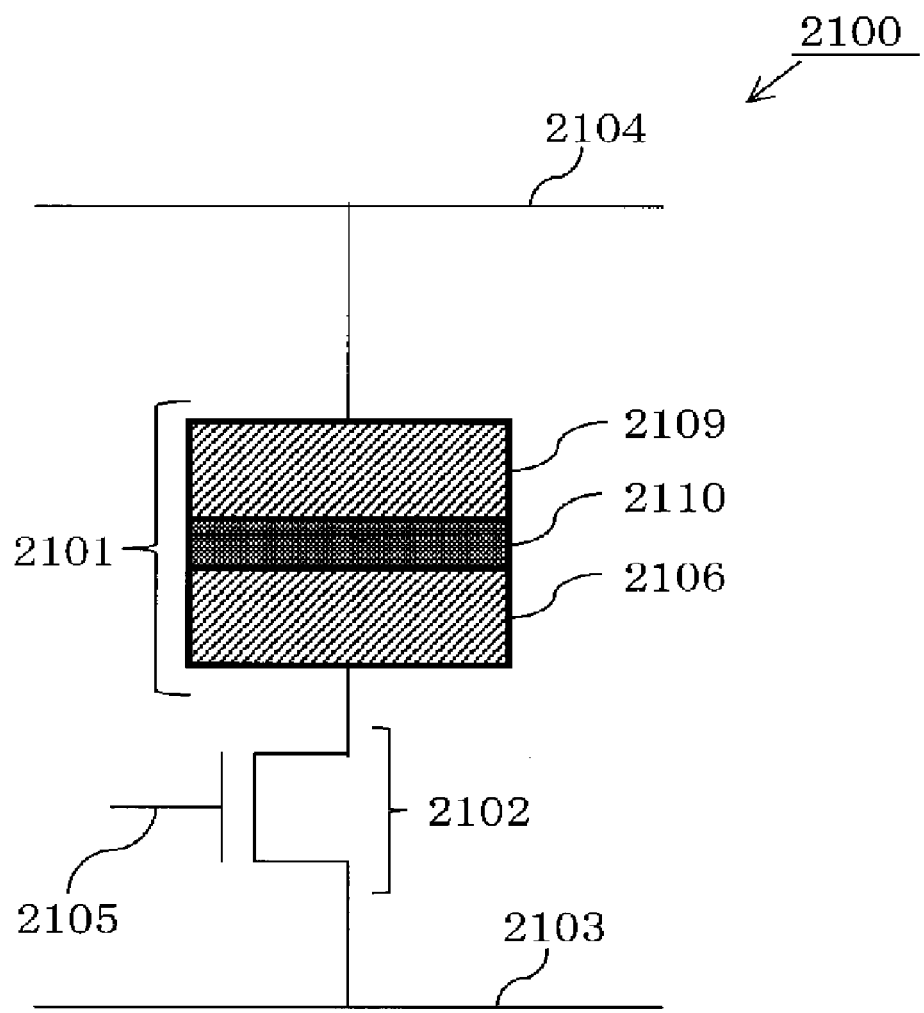
FIG. 24 is a sectional view schematically showing a memory cell of a magnetic memory including a conventional magnetoresistance effect element.
Figure 25:
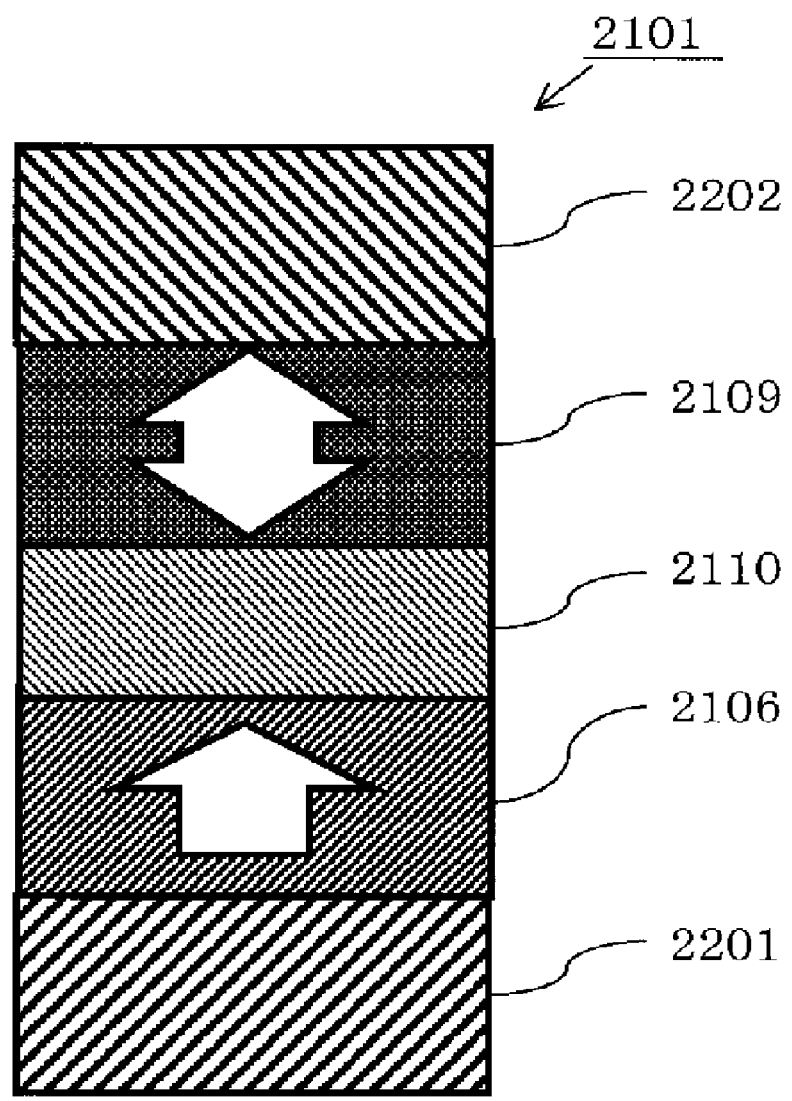
FIG. 25 is a sectional view showing the structure of a magnetoresistance effect element reported in non-patent literature 1.
Figure 26:
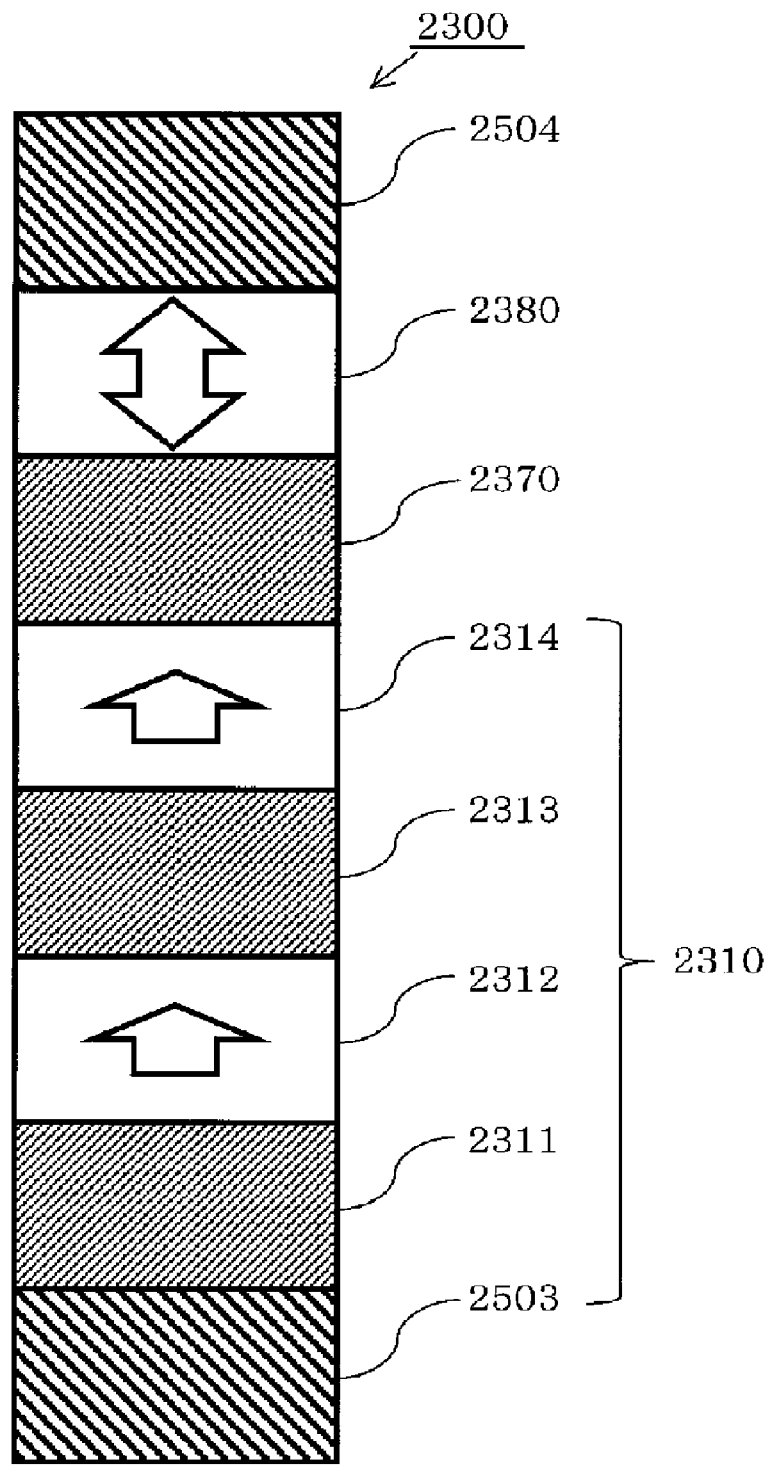
FIG. 26 is a sectional view showing the structure of a magnetoresistance effect element disclosed in patent literature 1.

FIG. 5 shows a comparison between the thermal stability of the magnetoresistance effect element 101 of this invention and that of a magnetoresistance effect element of the conventional structure shown in FIG. 24. The horizontal axis of FIG. 5 shows the area of a recording layer ($nm^2$) and the vertical axis of FIG. 5 shows a thermal stability index ($E/k_BT$).

Comparative Example shows the thermal stability index of the magnetoresistance effect element 2101 determined while the first ferromagnetic layer 2106 of fixed magnetization has a thickness of 0.9 nm, the second ferromagnetic layer 2109 of a variable magnetization direction has a thickness of 1.6 nm, and the first non-magnetic layer 2110 has a thickness of 0.9 nm.

The magnetoresistance effect element of Example has the element structure of FIG. 1 where Ta found by this invention is applied to the non-magnetic coupling layer 203 and Ta has a film thickness of 0.4 nm with the intention of obtaining sufficient magnetic coupling between the second and third ferromagnetic layers 109 and 204 as shown in Example 2. FIG. 5 shows the thermal stability index of the magnetoresistance effect element 101 relative to the area of the element.

In every area of the element, the magnetoresistance effect element 101 of the structure where Ta used by this invention is applied as the non-magnetic coupling layer 203 exhibits higher thermal stability. It is found accordingly that the magnetoresistance effect element 101 achieves a thermal stability index of 80 or more required to achieve an MRAM.

Figure 6:
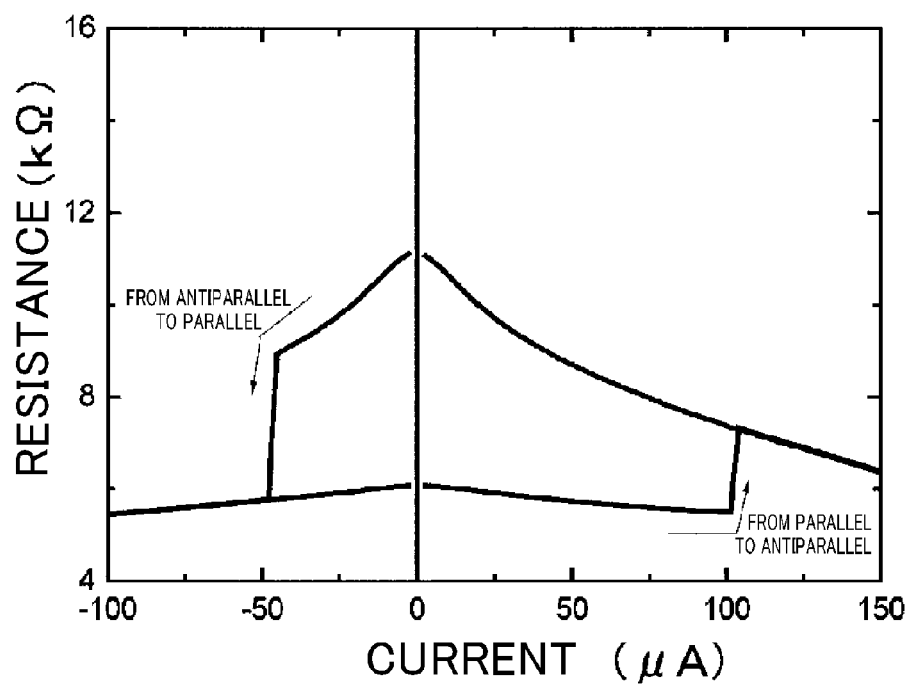
FIG. 6 shows a result of reversing the magnetization of a recording layer in a magnetoresistance effect element of the structure of FIG. 1 using a current (spin transfer torque).

FIG. 6 shows a result of reversing the magnetization of the recording layer in the magnetoresistance effect element 101 of the structure of FIG. 1 using a current (spin transfer torque). The horizontal axis shows a current (μA) applied to the magnetoresistance effect element 101 and the vertical axis shows the resistance value (kΩ) of the magnetoresistance effect element 101.

FIG. 6 shows that the magnetization of the magnetoresistance effect element 101 of this invention can be reversed with an external current. Specifically, FIG. 6 shows that magnetization can be changed with a current from a parallel condition to an antiparallel condition and from the antiparallel condition to the parallel condition in the absence of a magnetic field.

The foregoing results show that a magnetization condition can be changed with a current supplied from outside using the magnetoresistance effect element 101 of this invention.

In the example of FIG. 1, the magnetization of the reference layer of fixed magnetization points in the upward direction. Alternatively, this magnetization may be fixed in the downward direction.

In the examples of FIGS. 4, 5 and 6 using the structure of FIG. 1, the first, second, and third ferromagnetic layers 106, 109, and 204 are all made of CoFeB. Alternatively, the first ferromagnetic layer 106 of fixed magnetization may be formed of a multilayer film including Co and Pt or Pd, Ni and Pt or Pd, and the like. The first ferromagnetic layer 106 may alternatively be made of a different perpendicular magnetic anisotropy material conventionally known such as an FePt alloy or a TbFeCo alloy.

A layer made of a ferromagnetic substance including at least one of 3d transition metals such as Co, Fe, and Ni or made of a Heusler alloy may be inserted additionally between the first ferromagnetic layer 106 and the first non-magnetic layer 110. In order to obtain a high magnetoresistance ratio in the aforementioned structure, non-magnetic metal such as Ta, Cr or V may be inserted between the layer including at least one of Fe, Co and Ni in the first ferromagnetic layer 106 and the multilayer film including Co and Pt or Pd, Ni and Pt or Pd, and the like, or a ferromagnetic layer using a different perpendicular magnetic anisotropy material conventionally known such as an FePt alloy or a TbFeCo alloy.

First Modification

Figure 7:
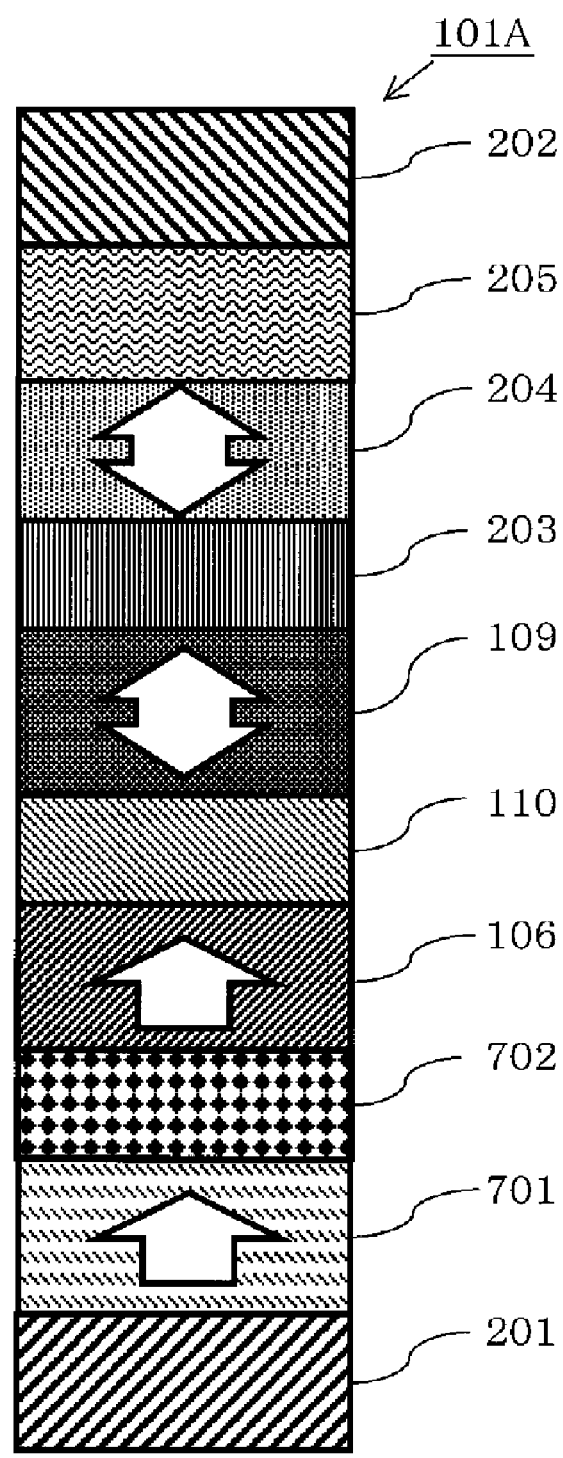
FIG. 7 is a sectional view showing a first modification of the magnetoresistance effect element of the first embodiment of this invention.

FIG. 7 is a sectional view showing the structure of a magnetoresistance effect element 101A according to a first modification of the first embodiment of this invention. The magnetoresistance effect element 101A of FIG. 7 differs from the magnetoresistance effect element 101 in its fixed layer. The fixed layer is formed of the first ferromagnetic layer 106 and additionally, a fourth ferromagnetic layer 701 and a second non-magnetic coupling layer 702. In an example of the sectional view of the magnetoresistance effect element 101A shown in FIG. 7, CoFeB is used to form the first ferromagnetic layer 106 adjacent to the first non-magnetic layer 110, and a non-magnetic material including at least one of Ta, Cr and V is inserted as the second non-magnetic coupling layer 702 under the first ferromagnetic layer 106. Further, a multilayer film including Co and Pt or Pd, Ni and Pt or Pd, and the like, or a ferromagnetic layer using a different perpendicular magnetic anisotropy material conventionally known such as an FePt alloy or a TbFeCo alloy, is formed as the fourth ferromagnetic layer 701 under the second non-magnetic coupling layer 702.

Second Modification

Figure 8:
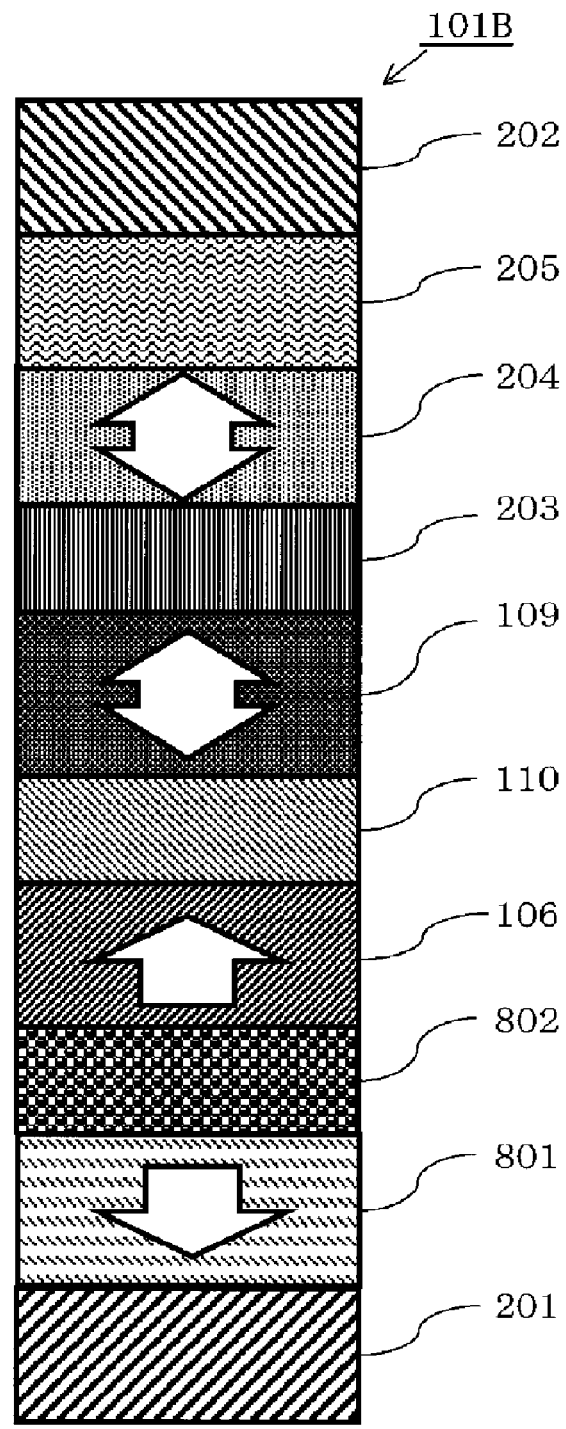
FIG. 8 is a sectional view showing a second modification of the magnetoresistance effect element of the first embodiment of this invention.

FIG. 8 is a sectional view showing the structure of a magnetoresistance effect element 101B according to a second modification of the first embodiment of this invention.

In the magnetoresistance effect element 101 shown in FIG. 1, the reference layer of fixed magnetization is formed as a single layer with the first ferromagnetic layer 106.

In the magnetoresistance effect element 101B of the second modification of this invention shown in FIG. 8, a fifth ferromagnetic layer 801 of magnetization pointing in a direction opposite the magnetization direction of the first ferromagnetic layer 106 may be inserted under the first ferromagnetic layer 106. This reduces a leakage magnetic field to act on a recording layer of a variable magnetization direction formed of the second and third ferromagnetic layers 109 and 204, so that the advantageous effects of the invention are emphasized further.

In the magnetoresistance effect element 101B of FIG. 8, a third non-magnetic coupling layer 802 to supply antiferromagnetic interlayer coupling is inserted between the first and fifth ferromagnetic layers 106 and 801.

According to non-patent literature 4, all transition metals except Pd, Pt, Ni, Fe and Co and alloys of all transition metals except Pd, Pt, Ni, Fe and Co become candidates for the third non-magnetic coupling layer 802. Antiferromagnetic interlayer coupling can be formed between the first and fifth ferromagnetic layers 106 and 801 by adjusting the thickness of the third non-magnetic coupling layer 802 appropriately.

In the example of FIG. 8, CoFeB is used as the first ferromagnetic layer 106. Further, a multilayer film including Co and Pt or Pd, Ni and Pt or Pd, and the like, or a different perpendicular magnetic anisotropy material conventionally known such as an FePt alloy or a TbFeCo alloy is a candidate for the fifth ferromagnetic layer 801.

A multilayer film of large perpendicular magnetic anisotropy energy including Co and Pt or Pd, Ni and Pt or Pd, and the like, or a different perpendicular magnetic anisotropy material conventionally known such as an FePt alloy or a TbFeCo alloy may be inserted between the first ferromagnetic layer 106 and the third non-magnetic coupling layer 802. In order to obtain a high magnetoresistance ratio in this structure, a non-magnetic material such as Ta, Cr or V may be inserted between the CoFeB layer and the conventional perpendicular magnetic anisotropy material.

Third Modification

Figure 9:
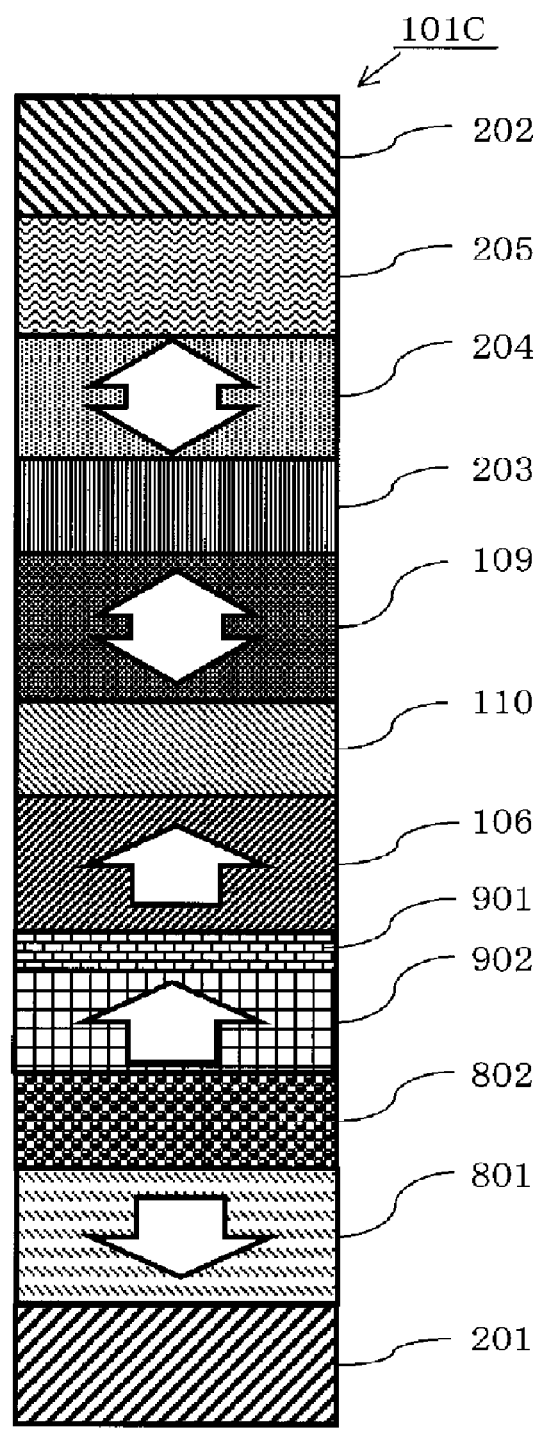
FIG. 9 is a sectional view showing a third modification of the magnetoresistance effect element of the first embodiment of this invention.

FIG. 9 is a sectional view showing the structure of a magnetoresistance effect element 101C according to a third modification of the first embodiment of this invention. In the example shown in FIG. 9, CoFeB is used as the first ferromagnetic layer 106 and Ta to form a fourth non-magnetic coupling layer 901 is inserted under the first ferromagnetic layer 106 in the magnetoresistance effect element 101B of FIG. 8. A sixth ferromagnetic layer 902 formed of a multilayer film including Co and Pt or Pd, Ni and Pt or Pd, and the like, or a different perpendicular magnetic anisotropy material conventionally known such as an FePt alloy or a TbFeCo alloy, is further formed under the fourth non-magnetic coupling layer 901.

Fourth Modification

Figure 10:
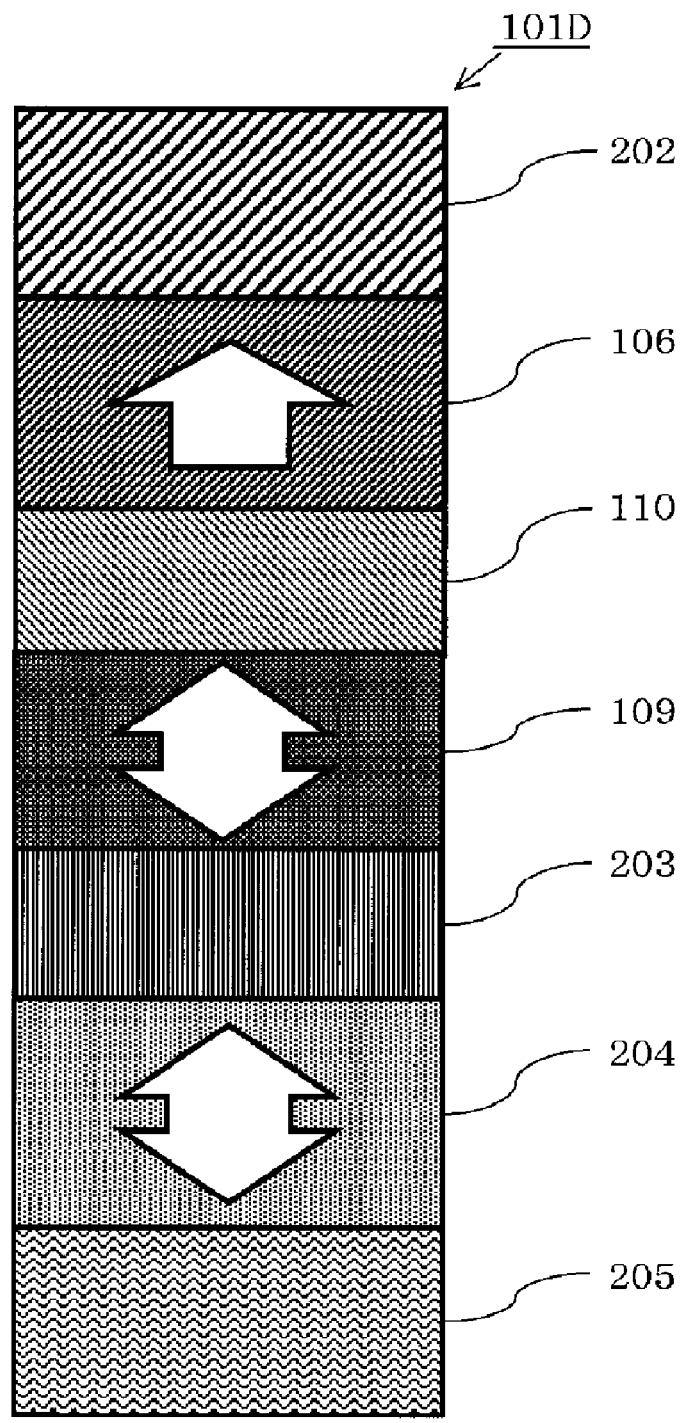
FIG. 10 is a sectional view showing a fourth modification of the magnetoresistance effect element of the first embodiment of this invention.

FIG. 10 is a sectional view showing the structure of a magnetoresistance effect element 101D according to a fourth modification of the first embodiment of this invention.

From a different viewpoint of this invention, even with a structure shown in FIG. 10 where a recording layer and a reference layer are arranged in opposite positions with respect to the first non-magnetic layer 110, this invention still achieves the same advantageous effects.

In Example 1, the ferromagnetic layer arranged under the first non-magnetic layer 110 functions as a reference layer of fixed magnetization and the second and third ferromagnetic layers 109 and 204 arranged over the first non-magnetic layer 110 function as a recording layer of a variable magnetization direction.

In the structure of FIG. 10, the recording layer and the reference layer 106 are arranged in opposite positions with respect to the first non-magnetic layer 106. In the example of FIG. 10, the non-magnetic coupling layer 203 is made of Ta, the first ferromagnetic layer 106 to become the reference layer, and the second and third ferromagnetic layers 109 and 204 to become the recording layer are all made of CoFeB, and the first and second non-magnetic layers 110 and 205 are made of MgO.

In the example of FIG. 10, the magnetization of the first ferromagnetic layer 106 as the reference layer of fixed magnetization points in the upward direction. Alternatively, this magnetization may point in the downward direction. The first ferromagnetic layer 106 may be formed of a multilayer film including Co and Pt or Pd, Ni and Pt or Pd, and the like, or a different perpendicular magnetic anisotropy material conventionally known such as an FePt alloy or a TbFeCo alloy.

Fifth Modification

In the magnetoresistance effect element 101D shown in FIG. 10, a layer made of a ferromagnetic substance including at least one of 3d transition metals such as Co, Fe, and Ni or a Heusler alloy may be inserted additionally under the first ferromagnetic layer 106. In order to obtain a higher magnetoresistance change ratio in this case, a non-magnetic material including any one of Ta, Cr and V may be inserted to form a fifth non-magnetic coupling layer 1101 over the aforementioned inserted layer made of the ferromagnetic substance including at least one of 3d transition metals such as Co, Fe, and Ni or the Heusler alloy, thereby obtaining a structure such as one illustrated in FIG. 11.

Figure 11:
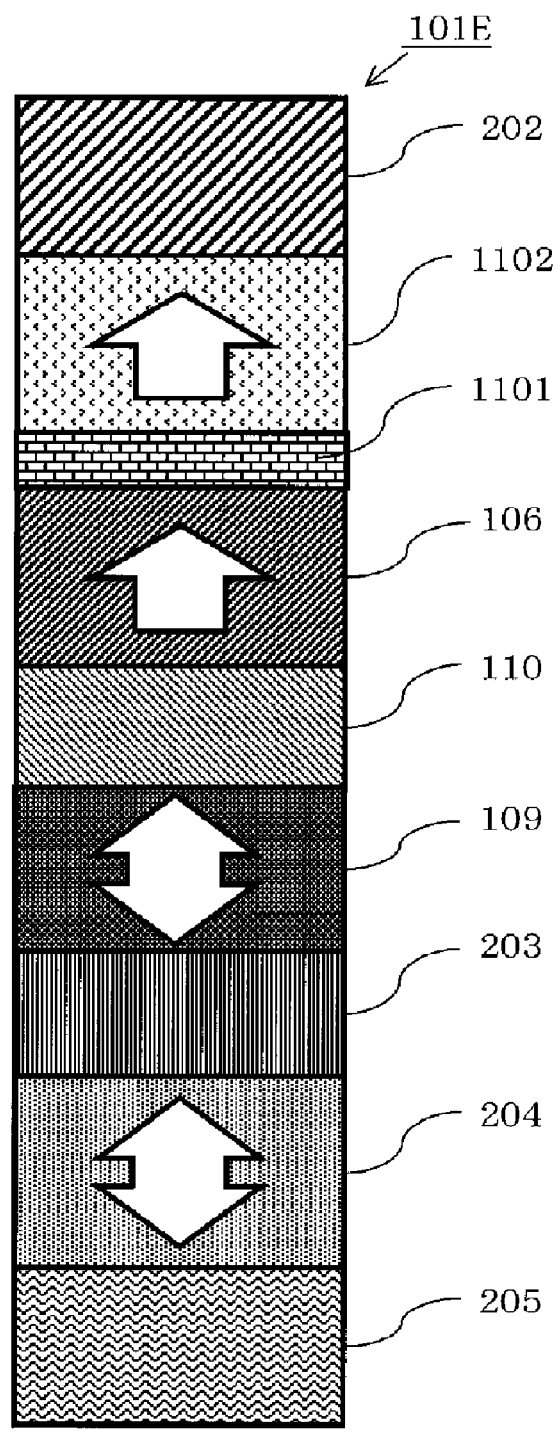
FIG. 11 is a sectional view showing a fifth modification of the magnetoresistance effect element of the first embodiment of this invention.

FIG. 11 is a sectional view showing the structure of a magnetoresistance effect element 101E according to a fifth modification of the first embodiment of this invention. As shown in FIG. 11, in the structure of the magnetoresistance effect element 101E of the fifth modification of this invention, the fifth non-magnetic coupling layer 1101 including any one of Ta, Cr and V and a seventh ferromagnetic layer 1102 are further inserted over the first ferromagnetic layer 106 of FIG. 10. The magnetization direction of the seventh ferromagnetic layer 1102 is fixed in the upward direction. Alternatively, this magnetization direction may be fixed in the downward direction.

Sixth Modification

From a different viewpoint of this invention, like in the second modification, an eighth ferromagnetic layer 1201 having a magnetization direction opposite that of the first ferromagnetic layer 106 may also be added over the first ferromagnetic layer 106 in the structure of FIG. 10.

Figure 12:
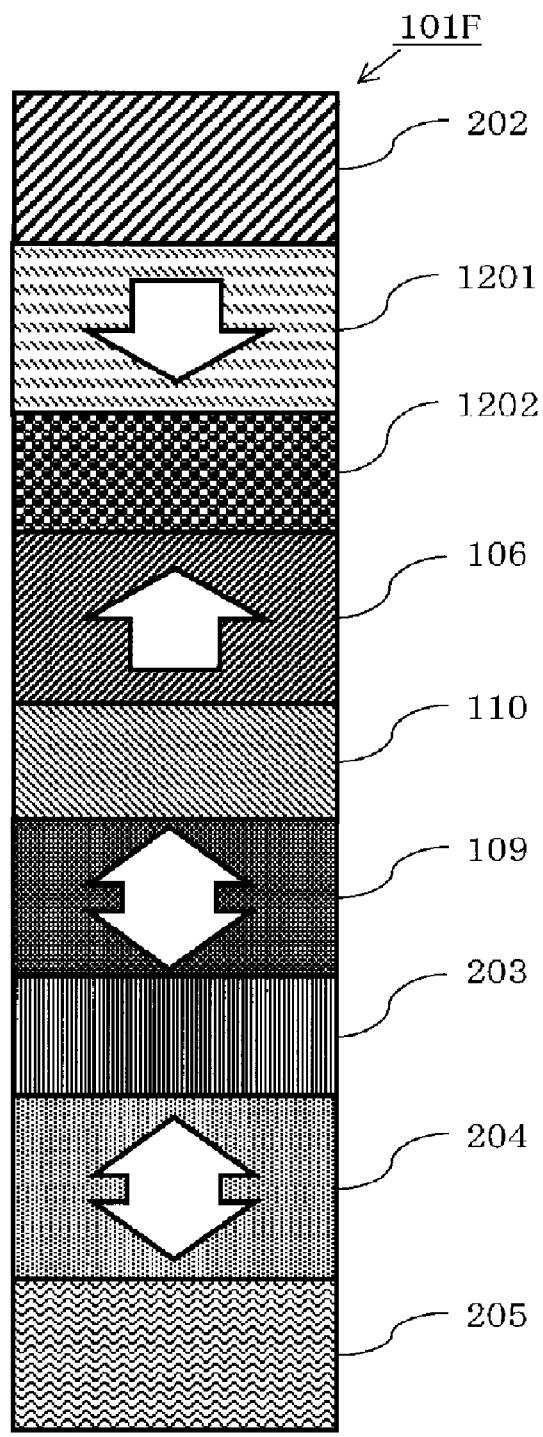
FIG. 12 is a sectional view showing a sixth modification of the magnetoresistance effect element of the first embodiment of this invention.

FIG. 12 is a sectional view showing the structure of a magnetoresistance effect element 101F according to a sixth modification of the first embodiment of this invention. As shown in FIG. 12, the magnetoresistance effect element 101F of the sixth modification of this invention further includes a sixth non-magnetic coupling layer 1202 to generate antiferromagnetic interlayer coupling stacked on the first ferromagnetic layer 106 of the magnetoresistance effect element 101D shown in FIG. 10, and the eighth ferromagnetic layer 1201 stacked on the sixth non-magnetic coupling layer 1202. The magnetization of the eighth ferromagnetic layer 1201 is fixed in a direction opposite that of the first ferromagnetic layer 106. In this structure, a multilayer film including Co and Pt or Pd, Ni and Pt or Pd, and the like, or a different perpendicular magnetic anisotropy material conventionally known such as an FePt alloy or a TbFeCo alloy, may be stacked further on the first ferromagnetic layer 106, as in the third modification.

Seventh Modification

Figure 13:
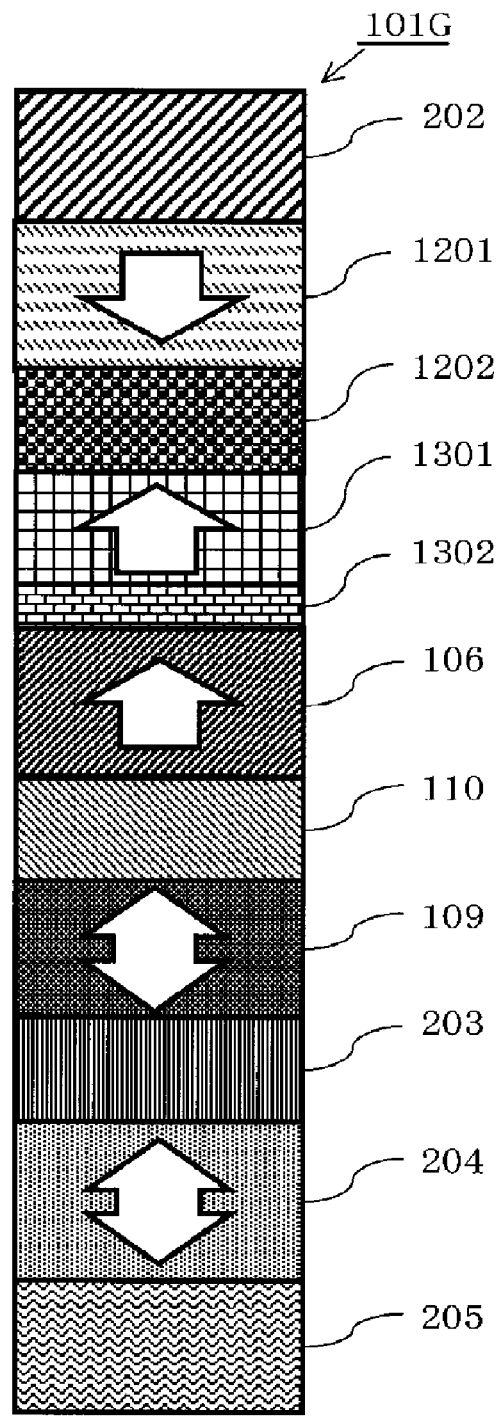
FIG. 13 is a sectional view showing a seventh modification of the magnetoresistance effect element of the first embodiment of this invention.

FIG. 13 is a sectional view showing the structure of a magnetoresistance effect element 101G according to a seventh modification of the first embodiment of this invention. As illustrated in FIG. 13, the magnetoresistance effect element 101G of the seventh modification of this invention further includes a ninth ferromagnetic layer 1301 formed over the first ferromagnetic layer 106 of the magnetoresistance effect element 101F shown in FIG. 12. In order to obtain a high magnetoresistance ratio, a seventh non-magnetic coupling layer 1302 formed of an alloy layer including at least one of Ta, Cr and V may be inserted between the ninth ferromagnetic layer 1301 made of a different perpendicular magnetic anisotropy material conventionally known and the first ferromagnetic layer 106.

From a different viewpoint of this invention, during manufacture of the second and third ferromagnetic layers 109 and 204, larger perpendicular magnetic anisotropy energy can be obtained by adjusting the respective positions of a sputtering target and a substrate relative to each other. Increasing a perpendicular magnetic anisotropy energy density allows increase in the thickness of a recording layer, leading to higher thermal stability.

[Magnetic Memory of First Embodiment of this Invention]

The following describes a magnetic memory of the first embodiment of this invention including the magnetoresistance effect element 101 of the first embodiment of this invention as a storage element.

Figure 14:
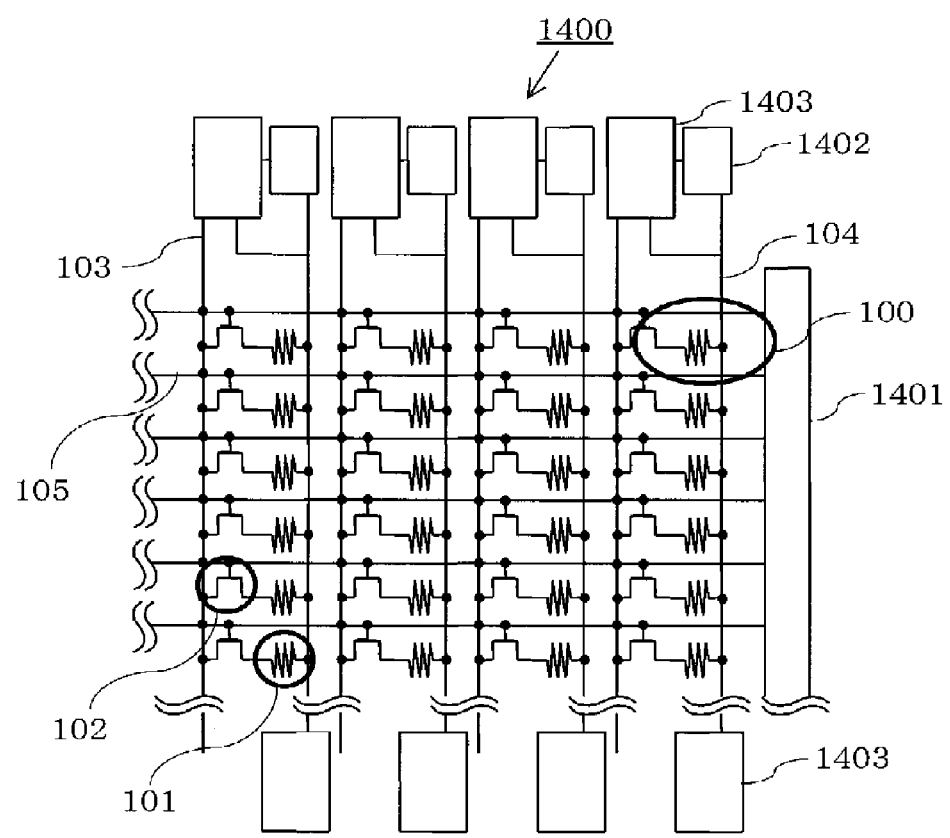
FIG. 14 is a block diagram showing the structure of a magnetic memory (MRAM) of the first embodiment of this invention including the magnetoresistance effect element of the first embodiment of this invention as a storage element.

FIG. 14 is a block diagram showing the structure of a magnetic memory (MRAM) 1400 including the magnetoresistance effect elements 101 and 101A to 101G of this invention as storage elements.

The magnetic memory of the first embodiment of this invention can achieve a magnetic memory (MRAM) by using the magnetoresistance effect elements 101 and 101A to 101G of Examples 1 and 2 and the first to seventh modifications as storage elements. As shown in FIG. 14, the magnetic memory 1400 has a memory array including multiple source lines 103 parallel to each other, bit lines 104 parallel to the source lines 103 and parallel to each other, multiple word lines 105 perpendicular to the bit lines 104 and parallel to each other, a circuit to apply a current in a direction perpendicular to a film surface of the magnetoresistance effect element 101 in a memory cell 100, and a peripheral circuit. The memory cell 100 of the magnetic memory 1400 is arranged at each point of intersection between the bit lines 104 and the word lines 105. A magnetoresistance effect element in the memory cell 100 may be any of the magnetoresistance effect elements 101 and 101A to 101G of Examples 1 to 7. As an example, the magnetoresistance effect element 101 of Example 1 is described herein as the magnetoresistance effect element in the memory cell 100.

The memory cell 100 in the magnetic memory 1400 includes the magnetoresistance effect element 101 of Examples 1 and 2 and the first to seventh modifications, and a selection transistor 102. The bit line 104 is electrically connected to a drain electrode of the selection transistor 102 through the magnetoresistance effect element 101. The source line 103 is electrically connected to a source electrode of the selection transistor 102 through an interconnect layer.

The word line 105 is electrically connected to a gate electrode of the selection transistor 102. One end of the source line 103 and one end of the bit line 104 are electrically connected to a write driver 1403 to apply a voltage and a sense amplifier 1402. One end of the word line 105 is electrically connected to a word driver 1401.

The selection transistor 102 and the surrounding circuit can be made by using MOS transistors. To reduce power consumption, these circuits may be made as what is called a CMOS integrated circuit that is an integrated circuit formed of a complementary MOS.

During action of writing "1," the write driver 1403 applies a voltage to the source line 103 and the word driver 1401 applies a voltage to the word line 105, thereby causing a current to flow from the source line 103 to the bit line 104 through the magnetoresistance effect element 101. At this time, the magnetization of the recording layer of a variable magnetization direction and that of the reference layer of a fixed magnetization direction in the magnetoresistance effect element 101 are antiparallel and the magnetoresistance effect element 101 is placed in a high-resistance condition. Thus, information to be retained becomes "1."

During action of writing "0," the write driver 1403 applies a voltage to the bit line 104 and the word driver 1401 applies a voltage to the word line 105, thereby causing a current to flow from the bit line 104 to the source line 103 through the magnetoresistance effect element 101. Specifically, during the action of writing "0," the current is caused to flow in a direction opposite the direction of the action of writing "1" to cause magnetization reversal by spin injection in the free layer of the magnetoresistance effect element 101. At this time, the magnetization of the recording layer of a variable magnetization direction and that of the reference layer of a fixed magnetization direction in the magnetoresistance effect element 101 are parallel and the magnetoresistance effect element 101 is placed in a low-resistance condition. Thus, information to be retained becomes "0."

During reading, a signal difference generated by resistance change is read using the sense amplifier 1402. Using the aforementioned memory array can achieve an MRAM including the magnetoresistance effect element 101 featuring a large magnetoresistance change ratio, a low reading current, and higher thermal stability than that of a conventional structure.

The magnetic memory 1400 of this invention can be made as follows.

First, the selection transistor 102 and the peripheral circuit may be formed on a substrate made for example of Si by a CMOS step. Then, the magnetoresistance effect element 101 of the magnetic memory 1400 of this invention may be formed. More specifically, the selection transistor and the peripheral circuit formed in the aforementioned step are entirely covered by a dielectric film. Then, an opening is formed only in an area to be connected to each electrode of the magnetoresistance effect element 101 and the magnetoresistance effect element 101 is formed. Next, the resultant magnetoresistance effect element 101, each memory cell 100, the bit line 104, the word line 105 and the like may be interconnected in a multilevel interconnect layer with an interlayer dielectric layer and electrode interconnection.

Each material may be deposited not only by sputtering but also by general thin film deposition process such as CVD, vapor deposition, laser ablation or MBE. A masking step of forming an electrode or an interconnect line of an integrated circuit into a certain shape can use exposure to light or EB exposure, for example.

[Magnetoresistance Effect Element of Second Embodiment of this Invention]

FIGS. 15 to 20 show a magnetoresistance effect element of a second embodiment of this invention. In the description below, structures same as those of the magnetoresistance effect element of the first embodiment of this invention are identified by the same signs and will not be described repeatedly for overlapping parts.

Figure 15:
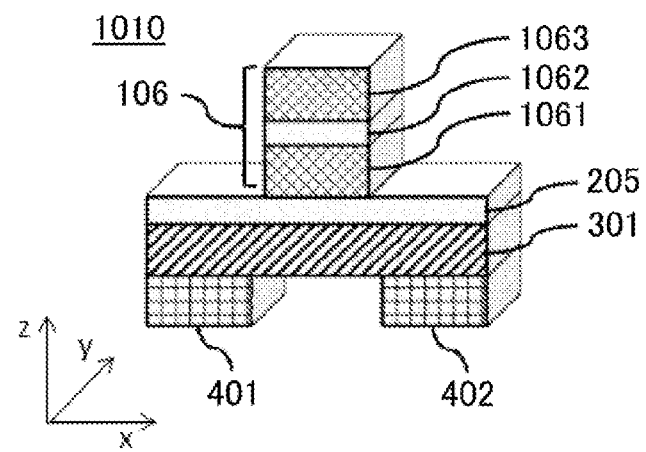
FIG. 15(a) is a perspective view and FIG. 15(b) is a sectional view each showing a magnetoresistance effect element of a second embodiment of this invention.
FIG. 15(c) is a plan view of a first magnetization free layer.
Figure 15:
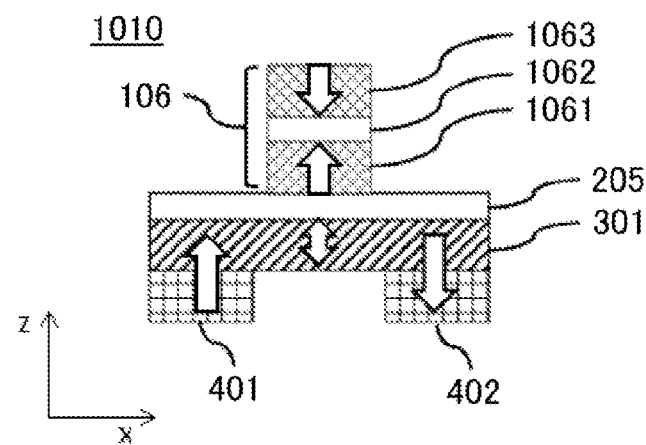
Figure 15:
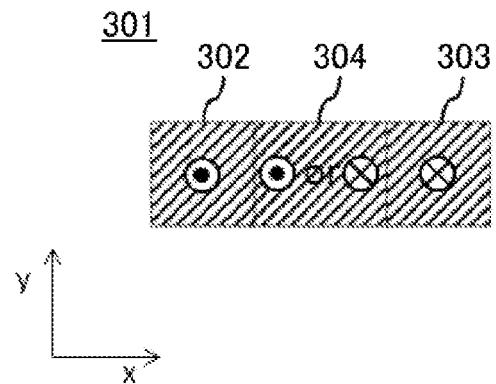

As shown in FIG. 15, a magnetoresistance effect element 1010 includes a first magnetization free layer 301, a second non-magnetic layer 205, a fixed layer 106, a magnetization fixed layer 401, and a magnetization fixed layer 402. Regarding the x-y-z coordinate system in FIG. 15, the z-axis indicates a direction perpendicular to a substrate, and the x-y axis is parallel to the plane of the substrate. This definition of the x-y-z coordinate system is applied to subsequent drawings. Arrows in FIG. 15(b) indicate respective magnetization directions of ferromagnetic substances in corresponding layers.

Figure 16:
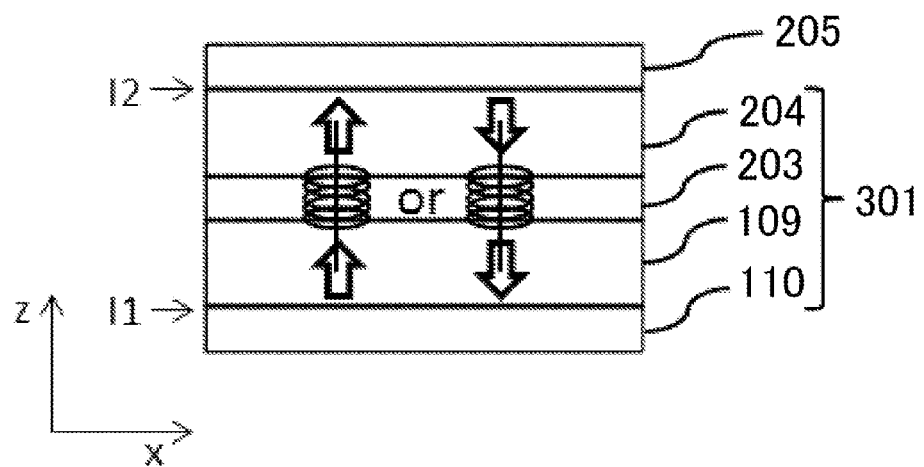
FIG. 16 is a sectional view showing a stacked structure of the first magnetization free layer and a second non-magnetic layer in the magnetoresistance effect element of FIG. 15.
Figure 17:
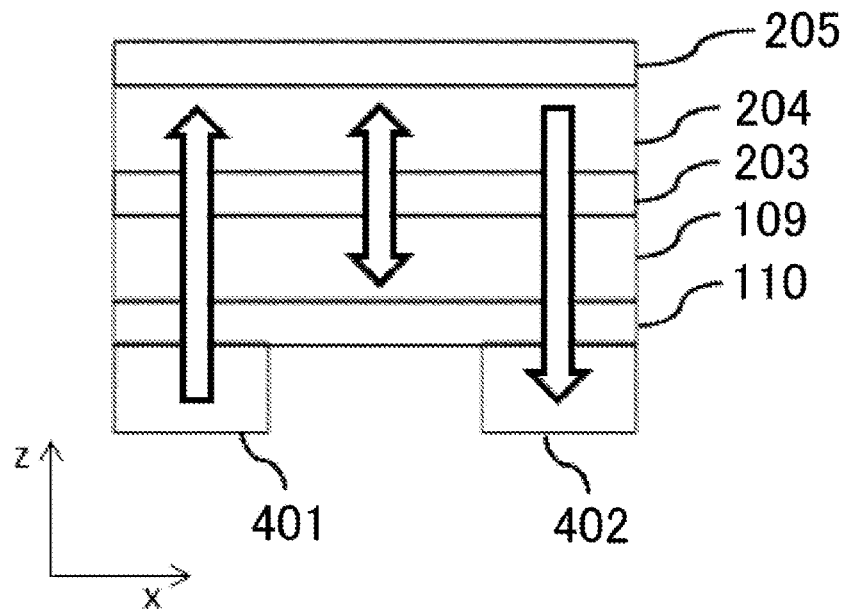
FIG. 17(a) is a sectional view showing the positions of the first magnetization free layer and magnetization fixed layers relative to each other.
FIG. 17(b) is a sectional view showing a modification of these positions.
Figure 17:
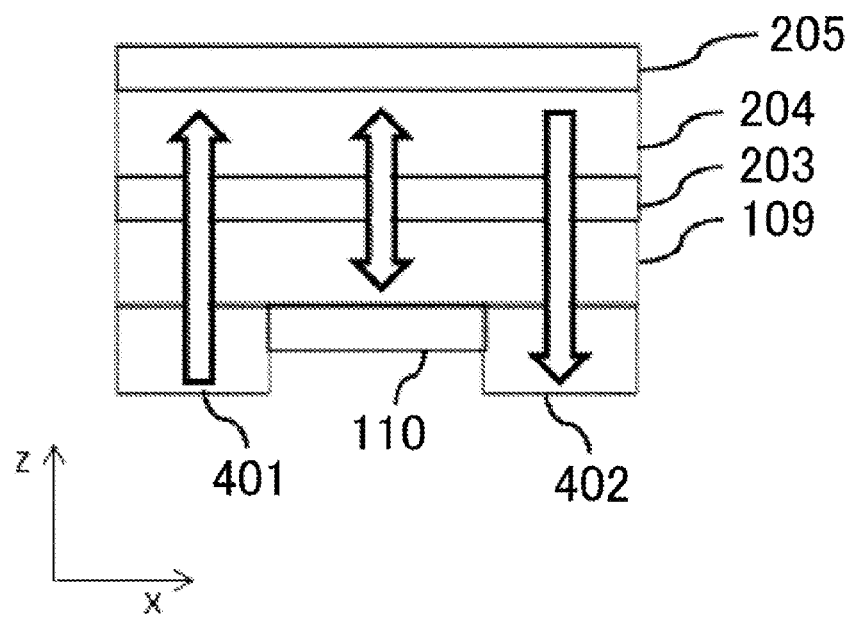

As shown in FIG. 16, the first magnetization free layer 301 includes a first non-magnetic layer 110, a second ferromagnetic layer 109, a non-magnetic coupling layer 203, and a third ferromagnetic layer 204 that are stacked in the order named. A second non-magnetic layer 205 is made of a non-magnetic substance and is adjacent to the third ferromagnetic layer 204. The second non-magnetic layer 205 is formed so as to cover one of surfaces of the first magnetization free layer 301 entirely.

A first interface I1 is formed at a boundary between the second ferromagnetic layer 109 and the first non-magnetic layer 110. A second interface I2 is formed at a boundary between the third ferromagnetic layers 204 and the second non-magnetic layer 205. The second and third ferromagnetic layers 109 and 204 include a ferromagnetic substance. It is particularly preferable that the second and third ferromagnetic layers 109 and 204 each include at least one of Fe, Co and Ni as 3d ferromagnetic transition metal elements. It is also preferable that the second and third ferromagnetic layers 109 and 204 each include at least one of B, C, N, O, F, Si, Al, P and S in order to place each of the second and third ferromagnetic layers 109 and 204 in an amorphous condition immediately after thin film deposition thereof. The second and first non-magnetic layers 205 and 110 include a non-magnetic substance. It is particularly preferable that the second and first non-magnetic layers 205 and 110 include at least one of N, O and C. This generates interface magnetic anisotropy in the direction perpendicular to the substrate at the first and second interfaces I1 and I2, so that an axis of easy magnetization in the second and third ferromagnetic layers 109 and 204 points in the direction perpendicular to the substrate.

In a specific example, the second and third ferromagnetic layers 109 and 204 are made of a Co—Fe—B alloy and a total of the respective thicknesses of the second and third ferromagnetic layers 109 and 204 is from 0.8 to 60 nm. The second and first non-magnetic layers 205 and 110 are made of Mg—O and the thicknesses of the second non-magnetic layer 205 is from 0.5 to 2 nm.

The non-magnetic coupling layer 203 includes metal. It is particularly preferable that the non-magnetic coupling layer 203 include at least one of Ta, Hf, Zr, Nb, Mo and Ti. In a specific example, the non-magnetic coupling layer 203 is made of Ta and has a thickness of 0.2 nm or more and less than 0.6 nm.

As shown in FIGS. 15(b) and 15(c), the first magnetization free layer 301 includes a first magnetization fixed area 302, a second magnetization fixed area 303, and a magnetization free area 304. In FIG. 15, the first magnetization free layer 301 is shown to extend in the x-axis direction and the magnetization free area 304 is arranged between the first and second magnetization fixed areas 302 and 303. However, this is not the only respective positions of the first and second magnetization fixed areas 302 and 303 and the magnetization free area 304 relative to each other. The first and second magnetization fixed areas 302 and 303 have magnetizations fixed in the z-axis direction and antiparallel to each other. In the example of FIG. 15, the magnetization of the first magnetization fixed area 302 is fixed in the +z direction and that of the second magnetization fixed area 303 is fixed in the −z direction. The magnetization of the magnetization free area 304 can point either in the +z direction or the −z direction.

As shown in FIG. 15, the fixed layer 106 is adjacent to the second non-magnetic layer 205 and on a side opposite the first magnetization free layer 301. The fixed layer 106 includes a ferromagnetic substance having perpendicular magnetic anisotropy and a fixed magnetization direction. The fixed layer 106 includes a tenth ferromagnetic layer 1061, a third non-magnetic layer 1062, and an eleventh ferromagnetic layer 1063. The tenth and eleventh ferromagnetic layers 1061 and 1063 are made of a ferromagnetic substance having perpendicular magnetic anisotropy. The third non-magnetic layer 1062 is made of a non-magnetic substance and is interposed between the tenth and eleventh ferromagnetic layers 1061 and 1063. The respective magnetizations of the tenth and eleventh ferromagnetic layers 1061 and 1063 are fixed in antiparallel directions. The third non-magnetic layer 1062 has the function of coupling the tenth and eleventh ferromagnetic layers 1061 and 1063 such that the respective magnetizations of the tenth and eleventh ferromagnetic layers 1061 and 1063 point in the antiparallel directions.

The tenth and eleventh ferromagnetic layers 1061 and 1063 include at least one of 3d ferromagnetic transition metals such as Fe, Co and Ni. The tenth and eleventh ferromagnetic layers 1061 and 1063 may have perpendicular magnetic anisotropy obtained by stacking these elements and Pt, Pd or Au alternately. Alternatively, the tenth and eleventh ferromagnetic layers 1061 and 1063 may be made of a perpendicular magnetic anisotropy material including a rare-earth metal such as Tb—Fe—Co, Gd—Fe—Co or Sm—Co, or an ordered alloy such as Fe—Pt, Fe—Pd or Co—Pt. The third non-magnetic layer 1062 may be made of any material. It is preferable that the third non-magnetic layer 1062 be made of Ru, Ir, Rh, Os or Re having the function of coupling the tenth and eleventh ferromagnetic layers 1061 and 1063 antiferromagnetically.

The fixed layer 106 is arranged so as to overlap at least the magnetization free area 304 of the first magnetization free layer 301 in the x-y plane. In the example shown in FIG. 15, the fixed layer 106 is arranged directly over the magnetization free area 304 so as to fall within the range of the magnetization free area 304 in the x-y plane. The fixed layer 106 is required only to overlap the magnetization free area 304 at least partially in the x-y plane. The fixed layer 106 may be larger than the magnetization free area 304.

As shown in FIG. 15, the magnetization fixed layers 401 and 402 each include a ferromagnetic substance at least partially. The magnetization fixed layers 401 and 402 contact the first and second magnetization fixed areas 302 and 303 of the first magnetization free layer 301 respectively and are magnetically coupled to the first and second magnetization fixed areas 302 and 303 respectively. This magnetic coupling may be exchange coupling or magnetostatic coupling. The magnetization fixed layers 401 and 402 have the function of fixing the respective magnetizations of the first and second magnetization fixed areas 302 and 303 of the first magnetization free layer 301 in antiparallel directions. Thus, the magnetization fixed layers 401 and 402 have respective magnetizations fixed in directions antiparallel to each other. As long as the magnetization fixed layers 401 and 402 fulfill this role, three or more magnetization fixed layers may be provided, or one magnetization fixed layer may be provided. Alternatively, a magnetization fixed layer may be omitted.

The magnetization fixed layers 401 and 402 include at least one of 3d ferromagnetic transition metal elements such as Fe, Co and Ni. The magnetization fixed layers 401 and 402 may have perpendicular magnetic anisotropy obtained by stacking these elements and Pt, Pd or Au alternately. Alternatively, the magnetization fixed layers 401 and 402 may be made of a perpendicular magnetic anisotropy material including a rare-earth metal such as Tb—Fe—Co, Gd—Fe—Co or Sm—Co, or an ordered alloy such as Fe—Pt, Fe—Pd or Co—Pt.

As shown in FIG. 17(a), the magnetization fixed layers 401 and 402 may be adjacent to the first non-magnetic layer 110 of the first magnetization free layer 301. Alternatively, as shown in FIG. 17(b), the magnetization fixed layers 401 and 402 may be adjacent to the second ferromagnetic layer 109 of the first magnetization free layer 301. To arrange the magnetization fixed layers 401 and 402 adjacent to the first non-magnetic layer 110 as shown in FIG. 17(a), the magnetization fixed layers 401 and 402 should be electrically continuous with the second ferromagnetic layer 109 and layers over the second ferromagnetic layer 109. Thus, the tunnel resistance of the first non-magnetic layer 110 should be sufficiently low. This electrical continuity can be achieved by thinning the first non-magnetic layer 110 and additionally, by increasing the roughness of upper parts of the magnetization fixed layers 401 and 402 to increase a leakage path for a current.

To arrange the magnetization fixed layers 401 and 402 adjacent to the second ferromagnetic layer 109 as shown in FIG. 17(b), a part of the second ferromagnetic layer 109 adjacent to the first non-magnetic layer 110 should have interface magnetic anisotropy to generate perpendicular magnetic anisotropy. Further, parts of the second ferromagnetic layer 109 adjacent to the magnetization fixed layers 401 and 402 should form exchange coupling with the magnetization fixed layers to generate perpendicular magnetic anisotropy. In this case, there is no upper limit of the thickness of the first non-magnetic layer 110.

The magnetoresistance effect element 1010 may include a contact layer formed of a conductor for connection to an external interconnect line.

[Memory Condition of Magnetoresistance Effect Element 1010]

In the magnetoresistance effect element 1010, the magnetization condition of the first magnetization free layer 301 is associated with storage information. As shown in FIG. 18(a), while the magnetoresistance effect element 1010 stores "0" as memory information, the magnetization of the magnetization free area 304 of the first magnetization free layer 301 points in the +z direction. At this time, the first and second magnetization fixed areas 302 and 303 point in the +z and −z directions respectively, so that a magnetic wall DW is formed at a boundary between the magnetization free area 304 and the second magnetization fixed area 303.

As shown in FIG. 18(b), while "1" is stored as memory information, the magnetization of the magnetization free area 304 of the first magnetization free layer 301 points in the −z direction. At this time, the first and second magnetization fixed areas 302 and 303 point in the +z and −z directions respectively, so that the magnetic wall DW is formed at a boundary between the magnetization free area 304 and the first magnetization fixed area 302.

As described above, the magnetization direction of the magnetization free area 304 of the first magnetization free layer 301 corresponds to storage information in the magnetoresistance effect element 1010 considered as a memory element. In other words, the position of the magnetic wall DW corresponds to storage information. This is not the only definition of a memory condition in the magnetoresistance effect element 1010. The respective magnetization directions of the first and second magnetization fixed areas 302 and 303 and the magnetization free area 304, and a memory condition can be associated in an arbitrary way.

[Method of Writing Information into Magnetoresistance Effect Element 1010]

Figure 18:
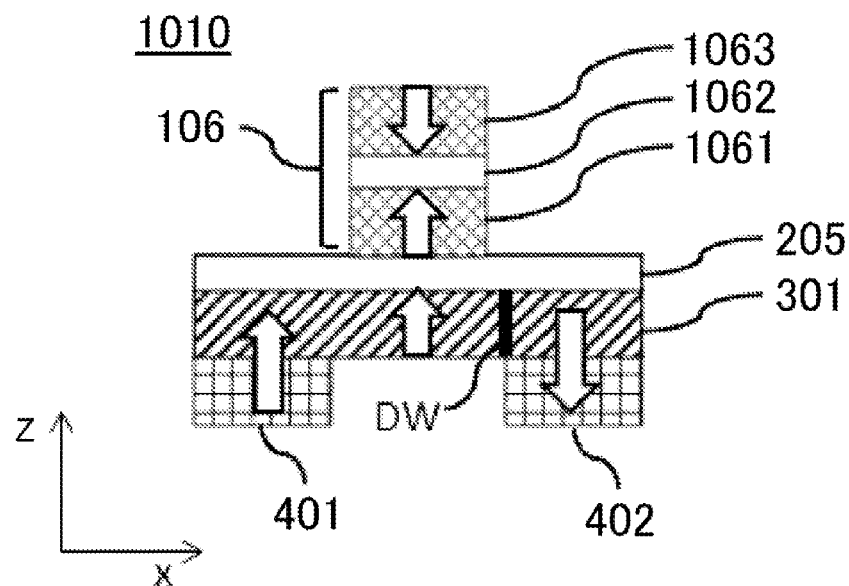
FIGS. 18(a) and 18(b) are sectional views showing the magnetization structures of the magnetoresistance effect element of FIG. 15 while the magnetoresistance effect element stores "0" and "1" as memory information respectively.
Figure 18:
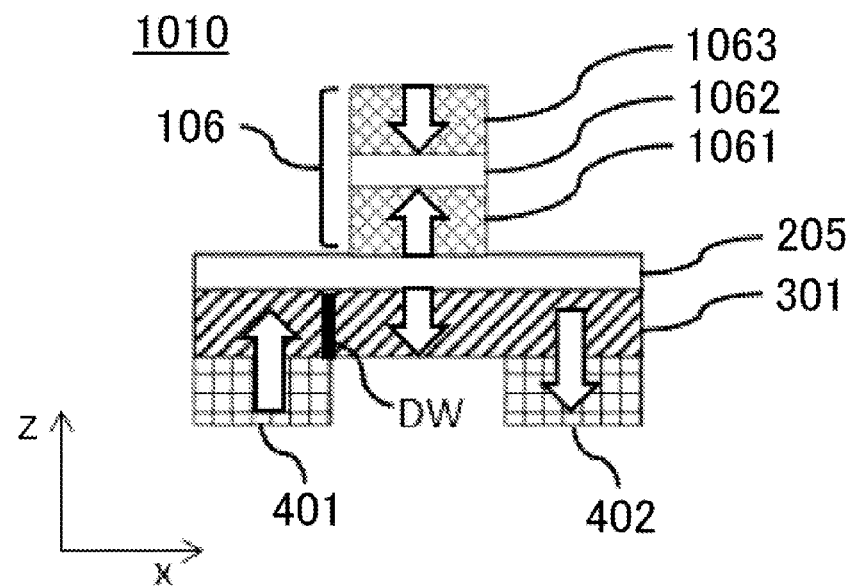

Information is written into the magnetoresistance effect element 1010 by moving the magnetic wall DW of FIG. 18 with a current. As shown in FIG. 19(a), to write "1" as memory information, a writing current Iw1 for "1" is introduced from the first magnetization fixed area 302 through the magnetization free area 304 into the second magnetization fixed area 303 in the first magnetization free layer 301. At this time, in the first magnetization free layer 301, conduction electrons flow from the second magnetization fixed area 303 through the magnetization free area 304 into the first magnetization fixed area 302. This generates a spin transfer torque acting on the magnetic wall DW formed at the boundary between the magnetization free area 304 and the second magnetization fixed area 303. Then, the magnetic wall DW moves from the boundary between the magnetization free area 304 and the second magnetization fixed area 303 to the boundary between the magnetization free area 304 and the first magnetization fixed area 302. The fixed magnetization of the first magnetization fixed area 302 makes the magnetic wall DW stop at the boundary between the magnetization free area 304 and the first magnetization fixed area 302. A magnetization condition thereby achieved is exactly the condition "1" shown in FIG. 18(b). In this way, storage information can be rewritten from the condition "0" to the condition "1" by introducing the writing current Iw1 for "1" into the magnetoresistance effect element 1010.

As shown in FIG. 19(b), to write "0" as memory information, a writing current Iw0 for "0" is introduced from the second magnetization fixed area 303 through the magnetization free area 304 into the first magnetization fixed area 302 in the first magnetization free layer 301. At this time, in the first magnetization free layer 301, conduction electrons flow from the first magnetization fixed area 302 through the magnetization free area 304 into the second magnetization fixed area 303. This generates a spin transfer torque acting on the magnetic wall DW formed at the boundary between the magnetization free area 304 and the first magnetization fixed area 302. Then, the magnetic wall DW moves from the boundary between the magnetization free area 304 and the first magnetization fixed area 302 to the boundary between the magnetization free area 304 and the second magnetization fixed area 303. The fixed magnetization of the second magnetization fixed area 303 makes the magnetic wall DW stop at the boundary between the magnetization free area 304 and the second magnetization fixed area 303. A magnetization condition thereby achieved is exactly the condition "0" shown in FIG. 18(a). In this way, storage information can be rewritten from the condition "1" to the condition "0" by introducing the writing current Iw0 for "0" into the magnetoresistance effect element 1010.

Figure 19:
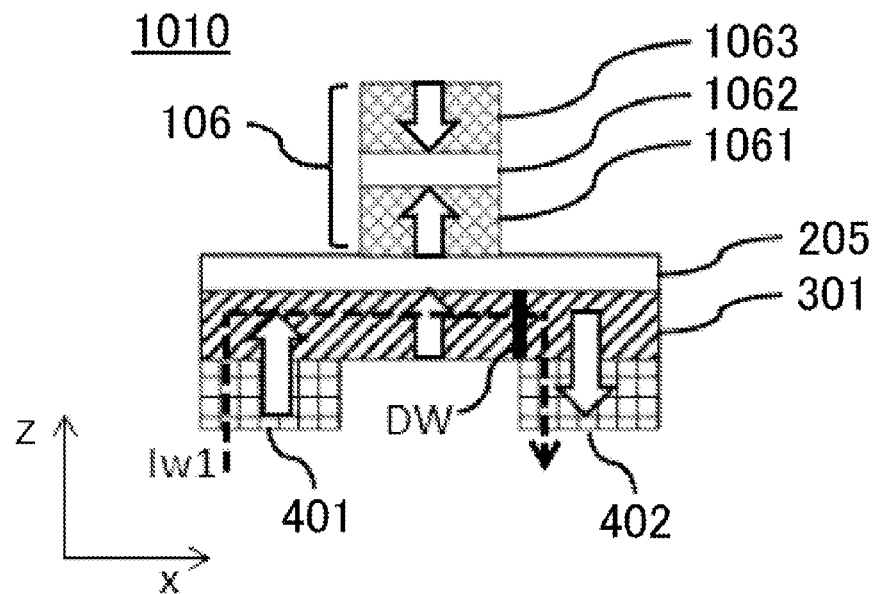
FIGS. 19(a) and 19(b) are sectional views showing methods of actions to write "1" as memory information and "0" as memory information into the magnetoresistance effect element of FIG. 15 respectively.
Figure 19:
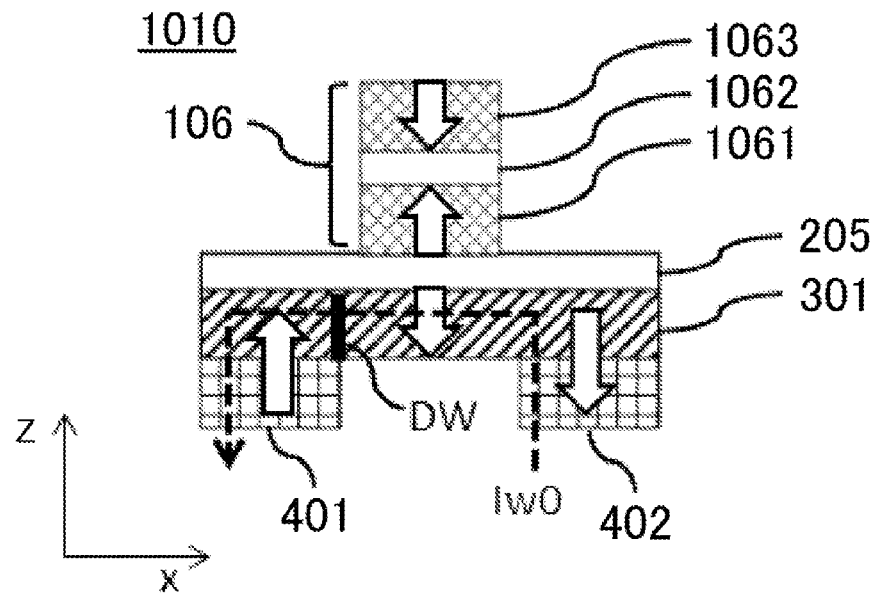

As described above, storage information can be rewritten between the condition "0" and the condition "1" by introducing a bidirectional writing current into the first magnetization free layer 301. In FIG. 19, the writing currents Iw1 and Iw0 pass through each of the magnetization fixed layers 401 and 402. However, this is not the only path for a writing current. The writing current can follow any path as long as it is introduced between the first magnetization fixed area 302 and the magnetization free area 304 or between the second magnetization fixed area 303 and the magnetization free area 304 in the first magnetization free layer 301.

Introducing the writing current Iw0 for "0" in the condition "0" and introducing the writing current Iw1 for "1" in the condition "1" do not change a memory condition. Specifically, information can be overwritten in the magnetoresistance effect element 1010.

[Method of Reading Information from Magnetoresistance Effect Element 1010]

The magnetization direction of the magnetization free area 304 of the first magnetization free layer 301 corresponds to storage information stored in the magnetoresistance effect element 1010. Information is read from the magnetoresistance effect element 1010 using magnetoresistance effect generated by a relative angle formed between the magnetization of the magnetization free area 304 and that of the tenth ferromagnetic layer 1061 of the fixed layer 106. Information is read from the magnetoresistance effect element 1010 by introducing a reading current Ir such that the reading current Ir passes through the fixed layer 106, the second non-magnetic layer 205, and the first magnetization free layer 301.

As shown in FIG. 20(a), while "0" is to be read as memory information, the magnetization direction of the tenth ferromagnetic layer 1061 of the fixed layer 106 adjacent to the second non-magnetic layer 205 points in the +z direction and the magnetization of the magnetization free area 304 of the first magnetization free layer 301 also points in the +z direction. Thus, a condition observed in response to introduction of a current in a direction in which the current passes through the fixed layer 106, the second non-magnetic layer 205, and the first magnetization free layer 301 is a low-resistance condition generated by magnetoresistance effect.

As shown in FIG. 20(b), while "1" is to be read as memory information, the magnetization direction of the tenth ferromagnetic layer 1061 of the fixed layer 106 adjacent to the second non-magnetic layer 205 points in the +z direction and the magnetization of the magnetization free area 304 of the first magnetization free layer 301 points in the −z direction. Thus, a condition observed in response to introduction of a current in a direction in which the current passes through the fixed layer 106, the second non-magnetic layer 205, and the first magnetization free layer 301 is a high-resistance condition generated by magnetoresistance effect.

In this way, the angle of the magnetization of the magnetization free area 304 relative to that of the tenth ferromagnetic layer 1061 changes a resistance in the magnetoresistance effect element 1010. Information can be read from the magnetoresistance effect element 1010 by using this difference in the resistance.

Figure 20:
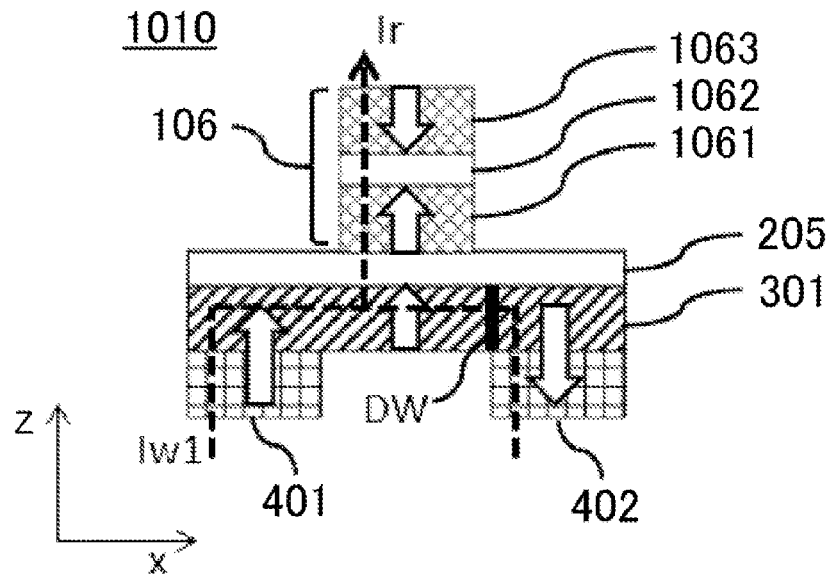
FIGS. 20(a) and 20(b) are sectional views showing methods of actions to read "0" as memory information and "1" as memory information from the magnetoresistance effect element of FIG. 15 respectively.
Figure 20:
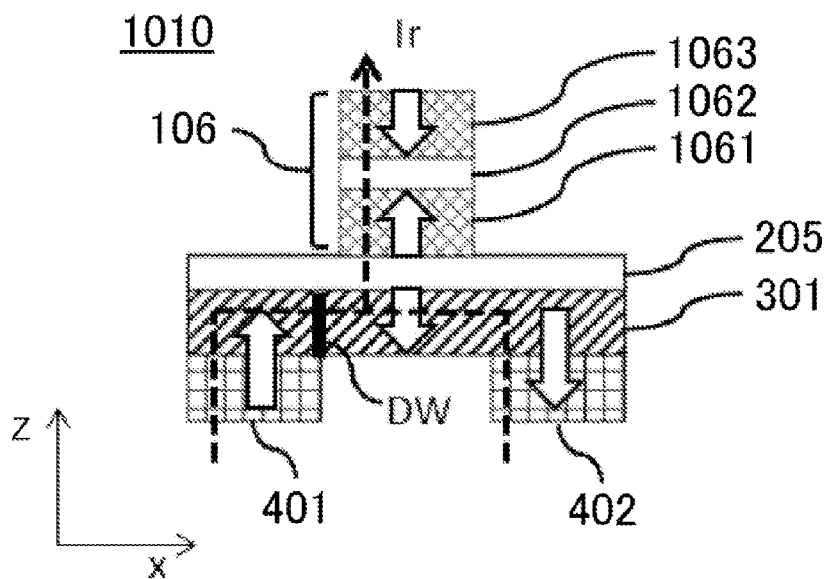

In FIG. 20, the reading current Ir is introduced from each of the magnetization fixed layers 401 and 402 to flow in the +z direction while passing through the first magnetization free layer 301, the second non-magnetic layer 205, and the fixed layer 106. However, this is not the only path for the reading current Ir. Specifically, the reading current Ir can follow any path as long as it flows in a direction in which the current passes through the tenth ferromagnetic layer 1061 of the fixed layer 106, the second non-magnetic layer 205, and the magnetization free area 304 of the first magnetization free layer 301.

Eighth Modification

Figure 21:
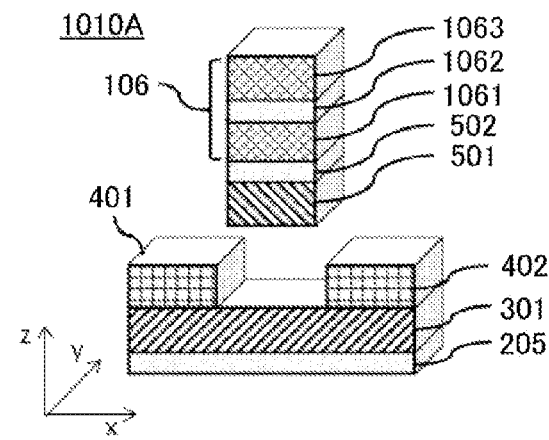
FIG. 21(a) is a perspective view.
FIG. 21(b) is an x-z sectional view.
FIG. 21(c) is a y-z sectional view each showing an eighth modification of the magnetoresistance effect element of the second embodiment of this invention.
Figure 21:
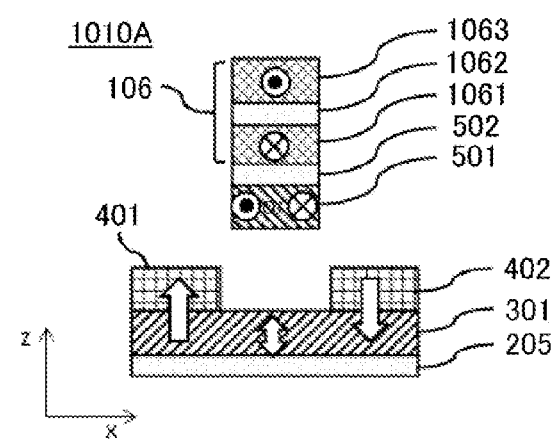
Figure 21:
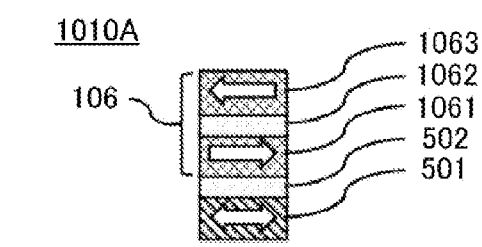
Figure 21:
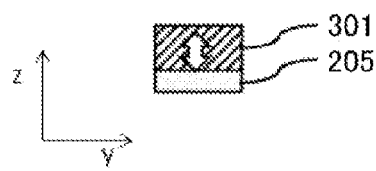

FIG. 21 shows an eighth modification of the magnetoresistance effect element of the second embodiment of this invention.

As shown in FIG. 21, a magnetoresistance effect element 1010A includes a first magnetization free layer 301, a second non-magnetic layer 205, a fixed layer 106, a magnetization fixed layer 401, a magnetization fixed layer 402, a second magnetization free layer 501, and a fourth non-magnetic layer 502. In the description below, structures same as those of the magnetoresistance effect element 1010 of the second embodiment of this invention are identified by the same signs and will not be described repeatedly for overlapping parts.

The second magnetization free layer 501 includes a ferromagnetic substance at least partially and has a magnetization direction that can be reversed in the x-y plane. Specifically, the second magnetization free layer 501 includes a ferromagnetic substance having in-plane magnetic anisotropy. The second magnetization free layer 501 is arranged so as to shift in the x-y plane from the center of the magnetization free area 304 of the first magnetization free layer 301. In the example shown in FIG. 21, the second magnetization free layer 501 is arranged so as to shift in the +y direction relative to the magnetization free area 304 of the first magnetization free layer 301.

The second magnetization free layer 501 can be made of any material. Actually, it is preferable that the second magnetization free layer 501 be made of a ferromagnetic substance including Fe, Co or Ni. In particular, the material and the thickness of the second magnetization free layer 501 can be designed so as to obtain intended reading characteristics.

The fourth non-magnetic layer 502 is interposed between the fixed layer 106 and the second magnetization free layer 501. The fourth non-magnetic layer 502 can be made of any material including any non-magnetic substance. It is preferable that a combination of the materials for the second magnetization free layer 501 and the fourth non-magnetic layer 502 be Co—Fe—B or Mg—O, for example.

As shown in FIG. 21, the magnetization fixed layers 401 and 402 are adjacent to the first and second magnetization fixed areas 302 and 303 of the first magnetization free layer 301 respectively and are arranged on the upper surfaces of the first and second magnetization fixed areas 302 and 303 respectively. The second non-magnetic layer 205 is adjacent to the lower surface of the first magnetization free layer 301.

Like the magnetoresistance effect element 1010, the magnetoresistance effect element 1010A determines whether information stored therein is "0" or "1" by determining whether the magnetization of the magnetization free area 304 of the first magnetization free layer 301 points in the upward direction or the downward direction. In the magnetoresistance effect element 1010A, if the magnetization free area 304 points in the upward direction (+z direction), a leakage magnetic field in the +y direction is generated at the position of the second magnetization free layer 501. This leakage flux points the magnetization of the second magnetization free layer 501 in the +y direction. At this time, the angle of the second magnetization free layer 501 becomes parallel relative to the tenth ferromagnetic layer 1061 of the fixed layer 106 adjacent to the fourth non-magnetic layer 502.

If the magnetization free area 304 points in the downward direction (−z direction), a leakage magnetic field in the −y direction is generated at the position of the second magnetization free layer 501. This leakage flux points the magnetization of the second magnetization free layer 501 in the −y direction. At this time, the angle of the second magnetization free layer 501 becomes antiparallel relative to the tenth ferromagnetic layer 1061 of the fixed layer 106 adjacent to the fourth non-magnetic layer 502. In this way, in the magnetoresistance effect element 1010A, the magnetization direction of the magnetization free area 304 of the first magnetization free layer 301 is transmitted as a leakage magnetic field to the second magnetization free layer 501. Reading is conducted by using magnetoresistance effect generated between the second magnetization free layer 501, the fourth non-magnetic layer 502, and the fixed layer 106.

The magnetoresistance effect element 1010A is shown as a four-terminal element in FIG. 21. Meanwhile, a stacked body responsible for reading formed of the second magnetization free layer 501, the fourth non-magnetic layer 502 and the fixed layer 106, the first magnetization free layer 301 responsible for writing and retaining of data, and the second non-magnetic layer 205 may be electrically connected. In this case, the magnetoresistance effect element 1010A becomes a three-terminal element.

[Magnetic Memory of Second Embodiment of this Invention]

Figure 22:
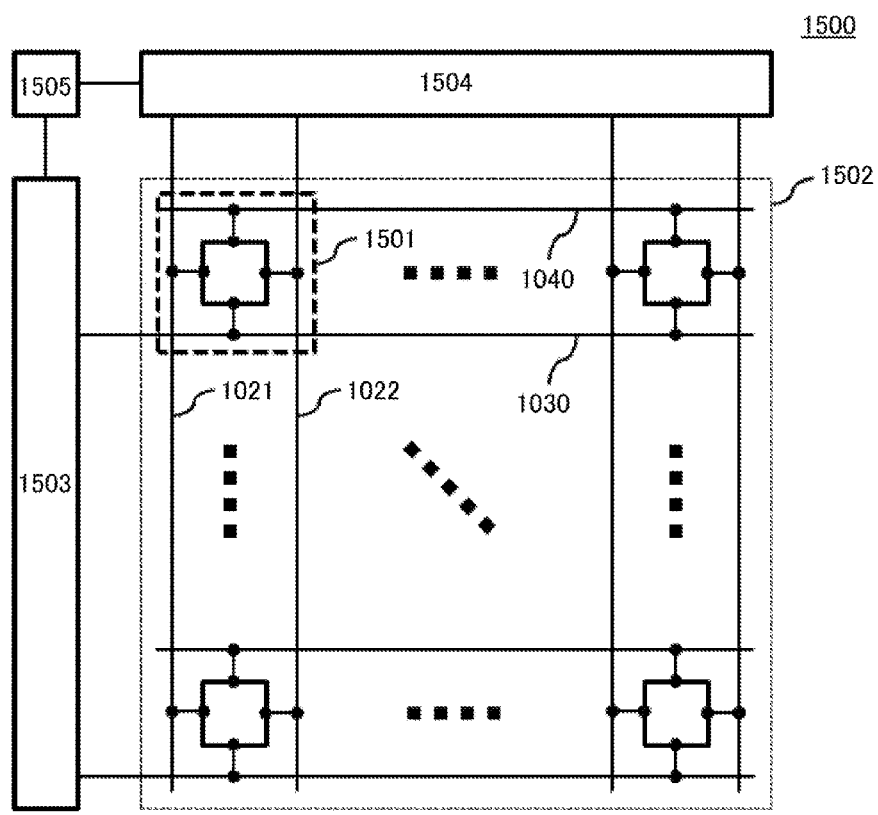
FIG. 22 is a circuit block diagram showing a magnetic memory of the second embodiment of this invention.
Figure 23:
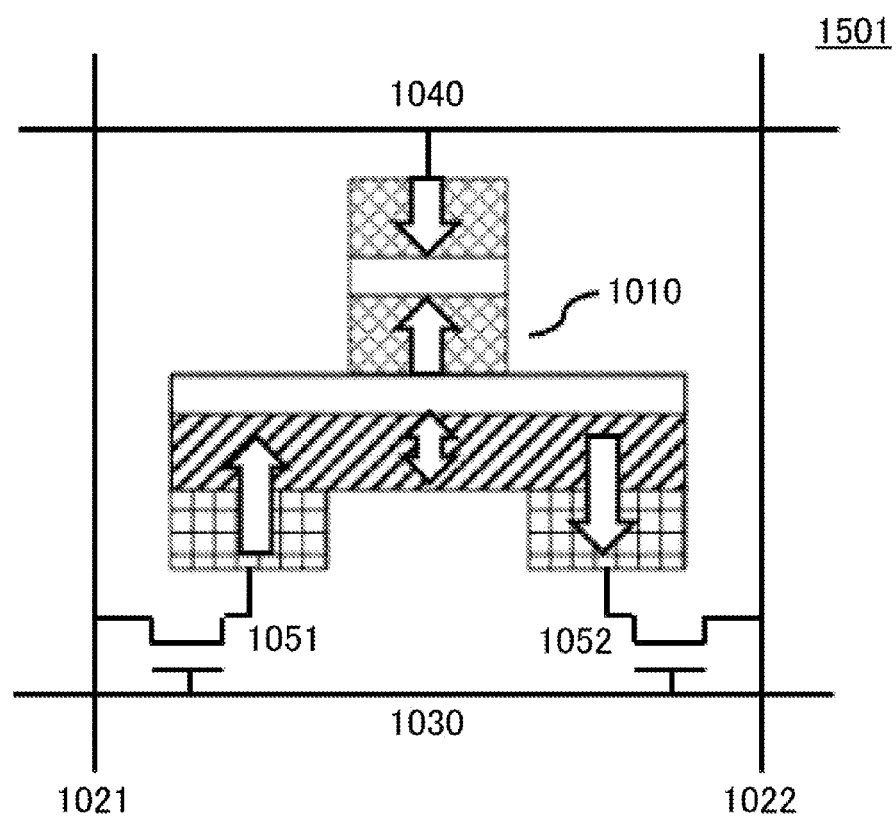
FIG. 23 is a circuit diagram showing a magnetic memory cell of the magnetic memory shown in FIG. 22.

FIGS. 22 and 23 show a magnetic memory of the second embodiment of this invention.

As shown in FIG. 22, a magnetic memory 1500 of the second embodiment of this invention has multiple magnetic memory cells 1501 arranged in an array. As shown in FIG. 23, each magnetic memory cell 1501 includes the magnetoresistance effect element 1010.

[Circuit Structure of Magnetic Memory 1500]

As shown in FIG. 23, in the magnetic memory cell 1501, the magnetoresistance effect element 1010 is connected to a first bit line 1021, a second bit line 1022, a word line 1030, and a ground line 1040. A terminal linked to the fixed layer 106 is connected to the ground line 1040. The first magnetization fixed area 302 is connected through the magnetization fixed layer 401 to a source or a drain of a first cell transistor 1051. The second magnetization fixed area 303 is connected through the magnetization fixed layer 402 to a source or a drain of a second cell transistor 1052. Respective gate electrodes of the first and second cell transistors 1051 and 1052 are connected to the word line 1030. A terminal of the first cell transistor 1051 on the opposite side of the source or the drain thereof connected to the magnetoresistance effect element 1010 is connected to the first bit line 1021 and a terminal of the second cell transistor 1052 on the opposite side of the source or the drain thereof connected to the magnetoresistance effect element 1010 is connected to the second bit line 1022.

For writing information, the first and second cell transistors 1051 and 1052 are placed in an ON condition by setting the word line 1030 at a High level. Further, either the first or second bit line 1021 or 1022 is set High, thereby enabling writing of information into the magnetoresistance effect element 1010.

For reading information, the first and second cell transistors 1051 and 1052 are placed in an ON condition by setting the word line 1030 at a High level. Further, both the first and second bit lines 1021 and 1022 are set High, or one of the first and second bit lines 1021 and 1022 is set High while the other is set Open, thereby enabling reading of information from the magnetoresistance effect element 1010.

As shown in FIG. 22, the magnetic memory 1500 includes a memory cell array 1502, an X driver 1503, a Y driver 1504, and a controller 1505. The memory cell array 1502 includes multiple magnetic memory cells 1501 arranged in an array. Each of the magnetic memory cells 1501 is connected to the first and second bit lines 1021 and 1022, the word line 1030, and the ground line 1040. The X driver 1503 is connected to multiple word lines 1030. The X driver 1503 is to drive some of these word lines 1030 linked to a magnetic memory cell 1501 to be accessed.

The Y driver 1504 is connected to multiple first bit lines 1021 and multiple second bit lines 1022. The Y driver 1504 is to place the first bit lines 1021 and the second bit lines 1022 in a condition ready for writing and reading of intended data. The controller 1505 is to control each of the X driver 1503 and the Y driver 1504 in response to writing or reading of data. The ground line 1040 connected to the fixed layer 106 of the magnetoresistance effect element 1010 is connected to the X driver 1503. This ground line 1040 can be replaced by a reading bit line connected to the Y driver 1504.

The circuit structures shown in FIGS. 22 and 23 are examples given to describe formation of the magnetic memory 1500 using the magnetoresistance effect element 1010 or 1010A. A magnetic memory having comparable effect can be provided by using a different circuit structure.

As described above, the magnetoresistance effect element 1010 includes a stacked structure with a stack of a ferromagnetic layer and a non-magnetic layer applied to a three-terminal magnetic memory of a movable magnetic wall. Thus, the magnetoresistance effect element 1010 is provided with a low writing current and a large reading signal simultaneously. Further, a total of the respective thicknesses of the second and third ferromagnetic layers 109 and 204 can be large in the first magnetization free layer 301. This can enhance the characteristics of retaining data dramatically, so that thermal stability, stability of operation, and ease of manufacture can be enhanced.

This invention is not limited to the aforementioned examples. Numerous modifications can be devised within the scope of the invention described in claims and these modifications can certainly fall within the scope of this invention.

INDUSTRIAL APPLICABILITY

The magnetoresistance effect element of this invention is applicable not only to a megabit-class or gigabit-class large-scale memory array but also to a temporary storage element of a single bit or several bits such as a register provided in a logic area of a kilobit-class or megabit-class cache memory or a system LSI operating at high speed. Additionally, the magnetoresistance effect element of this invention is applicable to a device such as a racetrack memory which stores multiple information segments using the magnetization direction of each of multiple magnetic domains formed on a thin line and which uses magnetic wall movement induced by a current for access to an intended bit.

Thus, the magnetic memory of this invention is considered to be applicable for example to a nonvolatile semiconductor memory device used in a mobile unit such as a portable phone or a personal computer, a memory part of a microcomputer built in a nonvolatile memory used in an automobile or a game machine, and a temporary storage element such as a cache memory or a register connected to a logic part.

REFERENCE SIGNS LIST

100 Memory cell of magnetic memory
101, 101A to 101G Magnetoresistance effect element
102 Selection transistor
103 Source line
104 Bit line
105 Word line
106 First ferromagnetic layer (fixed layer)
109 Second ferromagnetic layer
110 First non-magnetic layer
201 Foundation layer
202 Cap layer
203 Non-magnetic coupling layer
204 Third ferromagnetic layer
205 Second non-magnetic layer
701 Fourth ferromagnetic layer
702 Second non-magnetic coupling layer
801 Fifth ferromagnetic layer
802 Third non-magnetic coupling layer
901 Fourth non-magnetic coupling layer
902 Sixth ferromagnetic layer
1101 Fifth non-magnetic coupling layer
1102 Seventh ferromagnetic layer
1201 Eighth ferromagnetic layer
1202 Sixth non-magnetic coupling layer
1301 Ninth ferromagnetic layer
1302 Seventh non-magnetic coupling layer
1400 Magnetic memory (MRAM)
1401 Word driver
1402 Sense amplifier
1403 Write driver
1010, 1010A Magnetoresistance effect element
1021 First bit line
1022 Second bit line
1030 Word line
1040 Ground line
1051 First cell transistor
1052 Second cell transistor
1061 Tenth ferromagnetic layer
1062 Third non-magnetic layer
1063 Eleventh ferromagnetic layer
301 First magnetization free layer
302 First magnetization fixed area
303 Second magnetization fixed area
304 Magnetization free area
401, 402 Magnetization fixed layer
501 Second magnetization free layer
502 Fourth non-magnetic layer
1500 Magnetic memory
1501 Magnetic memory cell
1502 Memory cell array
1503 X driver
1504 Y driver
1505 Controller

The invention claimed is:

1. A magnetoresistance effect element, comprising:
a fixed layer including a first ferromagnetic layer of a magnetization direction invariable in a direction perpendicular to a film surface;
a second ferromagnetic layer of a magnetization direction variable in the direction perpendicular to the film surface;
a first non-magnetic layer adjacent to the second ferromagnetic layer;
a non-magnetic coupling layer adjacent to a surface of the second ferromagnetic layer on a side opposite the first non-magnetic layer;
a third ferromagnetic layer of a magnetization direction variable in the direction perpendicular to the film surface adjacent to a surface of the non-magnetic coupling layer on a side opposite the second ferromagnetic layer; and
a second non-magnetic layer adjacent to a surface of the third ferromagnetic layer on a side opposite the non-magnetic coupling layer,
wherein the second and third ferromagnetic layers each include at least one of Fe, Co and Ni and include at least one of B, C, N, O, F, Si, Al, P and S in order to place each of the second and third ferromagnetic layers in an amorphous condition immediately after thin film deposition thereof,
the second and third ferromagnetic layers have the same magnetization direction, and a total of the respective thicknesses of the second and third ferromagnetic layers is 2 nm or more, and
the non-magnetic coupling layer has a thickness of 0.3 nm or more and less than 1.0 nm.

2. The magnetoresistance effect element according to claim 1, wherein the non-magnetic coupling layer is made of metal including at least one of Ta, Hf, Zr, Nb, Mo and Ti.

3. The magnetoresistance effect element according to claim 1, wherein the first and second non-magnetic layers include at least one of N, O and C.

4. The magnetoresistance effect element according to claim 1, wherein the non-magnetic coupling layer is metal including Ta.

5. The magnetoresistance effect element according to claim 1, wherein the second and third ferromagnetic layers have a thickness from 0.8 to 60 nm.

6. The magnetoresistance effect element according to claim 1, wherein the second and third ferromagnetic layers include Co, Fe and B.

7. The magnetoresistance effect element according to claim 1, wherein the first and second non-magnetic layers are made of magnesium oxide.

8. The magnetoresistance effect element according to claim 1, comprising:
a first current terminal connected to the first ferromagnetic layer; and
a second current terminal connected to the second ferromagnetic layer, wherein
the first ferromagnetic layer is adjacent to a surface opposite the second ferromagnetic layer with respect to the first non-magnetic layer, and
the second and third ferromagnetic layers are reversed in magnetization by spin injection with a current.

9. The magnetoresistance effect element according to claim 1, comprising a first current terminal, a second current terminal, and a third current terminal, wherein
the second and third ferromagnetic layers include a first magnetization fixed area, a second magnetization fixed area, and a magnetization free area of a variable magnetization direction, the first and second magnetization fixed areas being magnetized in opposite directions,
the fixed layer is connected to the first current terminal,
the first magnetization fixed area is connected to the second current terminal, and
the second magnetization fixed area is connected to the third current terminal.

10. A magnetic memory comprising:
multiple source lines parallel to each other;
multiple word lines parallel to each other in a direction crossing the source lines;
multiple bit lines parallel to the source lines;
the magnetoresistance effect element as recited in claim 8 arranged in a place where the bit line and the word line cross each other; and
a circuit that applies a current in a direction perpendicular to a film surface of the magnetoresistance effect element, wherein
one of the first and second current terminals of the magnetoresistance effect element is electrically connected to a source electrode or a drain electrode of a selection transistor and the other of the first and second current terminals is electrically connected to the bit line,
the word line is electrically connected to a gate electrode of the selection transistor, and
the source line is electrically connected to the source electrode or the drain electrode of the selection transistor.

11. A magnetic memory comprising:
multiple first bit lines and multiple second bit lines parallel to each other;
multiple word lines parallel to each other in a direction crossing the first bit lines and the second bit lines;
the magnetoresistance effect element as recited in claim 9 arranged in a place where the first bit line and the second bit line cross the word line; and
a circuit that applies a current into a film surface of the magnetoresistance effect element and in a direction perpendicular to the film surface, wherein
the second current terminal is electrically connected to a source electrode or a drain electrode of a first selection transistor,
the third current terminal is electrically connected to a source electrode or a drain electrode of a second selection transistor,
the other of the source and drain electrodes of the first selection transistor is electrically connected to the first bit line,
the other of the source and drain electrodes of the second selection transistor is electrically connected to the second bit line, and
a gate electrode of the first selection transistor is connected to the word line and a gate electrode of the second selection transistor is connected to the word line.

12. A magnetoresistance effect element, comprising:
a fixed layer including a first ferromagnetic layer of a magnetization direction invariable in a direction perpendicular to a film surface;
a second ferromagnetic layer of a magnetization direction variable in the direction perpendicular to the film surface;
a first non-magnetic layer adjacent to the second ferromagnetic layer;
a non-magnetic coupling layer adjacent to a surface of the second ferromagnetic layer on a side opposite the first non-magnetic layer;
a third ferromagnetic layer of a magnetization direction variable in the direction perpendicular to the film surface adjacent to a surface of the non-magnetic coupling layer on a side opposite the second ferromagnetic layer; and
a second non-magnetic layer adjacent to a surface of the third ferromagnetic layer on a side opposite the non-magnetic coupling layer,
wherein the second and third ferromagnetic layers each include at least one of Fe, Co and Ni and include at least one of B, C, N, O, F, Si, Al, P and S,
the second and third ferromagnetic layers have the same magnetization direction, and a total of the respective thicknesses of the second and third ferromagnetic layers is 2 nm or more, and
the non-magnetic coupling layer has a thickness of 0.3 nm or more and less than 1.0 nm.

* * * * *